(12) United States Patent
Jeong et al.

(10) Patent No.: US 7,729,893 B2
(45) Date of Patent: Jun. 1, 2010

(54) METHODS, MEDIA, AND MEANS FOR FORMING ASYNCHRONOUS LOGIC NETWORKS

(75) Inventors: Cheoljoo Jeong, Cupertino, CA (US); Steven M. Nowick, Leonia, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 12/301,359

(22) PCT Filed: May 24, 2007

(86) PCT No.: PCT/US2007/012472

§ 371 (c)(1),
(2), (4) Date: Nov. 18, 2008

(87) PCT Pub. No.: WO2007/139928

PCT Pub. Date: Dec. 6, 2007

(65) Prior Publication Data

US 2009/0113375 A1    Apr. 30, 2009

Related U.S. Application Data

(60) Provisional application No. 60/808,308, filed on May 24, 2006, provisional application No. 60/906,481, filed on Mar. 12, 2007.

(51) Int. Cl.
G06F 17/50 (2006.01)
G06F 3/00 (2006.01)

(52) U.S. Cl. .................. 703/2; 703/14; 716/4; 326/41

(58) Field of Classification Search .................. 703/2, 703/14–17; 370/465; 716/4; 326/41
See application file for complete search history.

(56) References Cited

U.S. PATENT DOCUMENTS

| | | | |
|---|---|---|---|
| 2003/0165158 A1* | 9/2003 | Davies et al. | 370/465 |
| 2006/0120189 A1* | 6/2006 | Beerel et al. | 365/203 |
| 2007/0164785 A1* | 7/2007 | He | 326/41 |
| 2007/0300203 A1 | 12/2007 | Jeong et al. | |

OTHER PUBLICATIONS

Brej, C. F., "Early Output Logic and Anti-Tokens", PhD thesis, University of Manchester, 2005.
Brent, R.P. et al., "A regular layout for parallel adders," IEEE Trans. Comput., 1982.
Burns, S. M., "General conditions for the decomposition of state holding elements", In Proc. Int. Symp. Asynchronous Circuits and System, 1996, pp. 48-57.

(Continued)

*Primary Examiner*—Thai Phan
(74) *Attorney, Agent, or Firm*—Wilmer Cutler Pickering Hale and Dorr LLP

(57) ABSTRACT

Methods, media, and means for forming asynchronous logic networks are provided. In some embodiments, methods for forming an asynchronous logic network are provided. The methods include: receiving a logic network including vertices and signals, wherein the vertices include vertices with multiple output signals; determining a set of signals of the signals included in the logic network to be covered; selecting at least one vertex in the logic network to cover each signal in the set of signals; replacing the at least one selected vertex with a robust vertex; and replacing at least one non-selected vertex with a relaxed vertex.

48 Claims, 24 Drawing Sheets

OTHER PUBLICATIONS

Constantinescu, C., "Trends and challenges in VLSI circuit reliability," IEEE Micro, 2003, 23(4):14-99.
International Search Report and Written Opinion issued for corresponding International Patent Application No. PCT/US2007/012472.
Cortadella, J., "Decomposition and technology mapping of speed-independent circuits using Boolean relations," IEEE Trans. Computer-Aided Des. Integr. Circuits Syst., 1999, 18(9):1221-1236.
David, I. et al., "An efficient implementation of boolean functions as self-timed circuits," IEEE Trans. Comput., 1992, 41(1):2-11.
De Micheli, G. et al., "Synthesis and Optimization of Digital Circuits," McGraw Hill, 1994.
Fant, K.M., "Logically-Determined Design," John Wiley & Sons, 2005.
Folco, B. et al., "Technology mapping for area optimized quasi delay insensitive circuits," In Proc. IFIP Conf. Very Large Scale Integration Systems, 2005.
Jeong C. et al., "Optimal technology mapping and cell merger for asynchronous threshold networks," In Proc. Int. Symp. Asynchronous Circuits and Systems, 2006, pp. 128-137.
Jeong et al., "Optimization of robust asynchronous circuits by local input completeness relaxation," In Asia and South Pacific Des. Autom. Conf., 2007.
Jeong, C. et al., "Optimization for Timing-Robust Asynchronous Circuits Based on Eager Evaluation," Presented at International Workshop on Logic Synthesis (IWLS), 2007.
Karaki, N., "Asynchronous Design: An Enabler for Flexible Microelectronics," Proceedings 12th IEEE International Symposium on Asynchronous Circuits and Systems, ASYNC 2006, Mar. 13-15, 2006.
Kondratyev, A. et al., "Checking delay-insensitivity: 104 gates and beyond," In Proc. Int. Symp. Asynchronous Circuits and Systems, 2002, pp. 149-157.
Kondratyev, A. et al., "Design of asynchronous circuits using synchronous CAD tools," IEEE Design & Test of Computers, 2002, 19(4):107-117.
Ligthart, M. et al., "Asynchronous design using commercial HDL synthesis tools," In Proc. Int. Symp. Asynchronous Circuits and Systems, 2000, pp. 114-125.
Martin, A. J., "The limitations to delay-insensitivity in asynchronous circuits," Technical Report Caltech-CS-TR-90-02, Department of Computer Science, California Institute of Technology, 1990.
Martin, A., "Compiling communicating processes into delay-insensitive VLSI circuits," Distributed Computing, 1986, 1(4).
Martin, A.J., "Asynchronous Datapaths and the Design of an Asynchronous Adder," Formal Methods in System Design, 1: 117-137 (1992).
McCardle J. et al., "Measuring an asynchronous processor's power and noise," In Proc. Synopsys User Group Conference, 2001.
Muller, D.E., "Asynchronous Logics and Application to Information Processing," Switching Theory in Space Technology, Stanford University Press, 1963, pp. 289-297.
Nielsen, C.D., "Evaluation of Function Blocks for Asynchronous Design," In Proc. EuroDAC'94, 1994, pp. 454-459.
Rotem, S. et al., "RAPPID: An Asynchronous Instruction Length Decoder," In Proc. ASYNC'99, 1999, pp. 1-11.
Rudell, R.L. et al., "Multiple-Valued Minimization for PLA Optimization," IEEE Transactions on Computer-Aided Design, vol. CAD-6, No. 5, Sep. 1987, pp. 727-750.
Rudell, R.L., "Logic Synthesis for VLSI Design," Ph.D. thesis, UCB/ERL M89/49, Electronics Research Laboratory, University of California at Berkeley, 1989.
Singh, M. et al., "An Adaptively-Pipelined Mixed Synchronous-Asynchronous Digital FIR Filter Chip Operating at 1.3 GigaHertz," In Proceeding of the Eighth International Symposium on Asynchronous Circuits and Systems (ASYNC '02), 2002, pp. 1-12.
Singh, N. P., "A design methodology for self-timed systems," Technical Report MIT/LCS/TR-258, Laboratory for Computer Science, MIT, 1981, Master's thesis.
Smith, S. C. et al., "Optimization of NULL convention self-timed circuits," Integration, the VLSI Journal, 2004, 37:135-165.
Smith, S.C. et al., "Delay-Insensitive Gate-Level Pipelining," Intergration, The VLSI Journal, vol. 30, No. 2, Nov. 2001, pp. 103-131.
Sobelman, G. E. et al., "CMOS circuit design of threshold gate with hystersis," In Proc. Int. Symp. Circuits Systems, 1998, pp. 61-64.
Spars, J. et al., "Design of delay insensitive circuits using multi-ring structures," In Proc. European Des. Autom. Conf., 1992, pp. 15-20.
Van Berkel, C. H. et al., "Scanning the technology: Applications of asynchronous circuits," Proc. IEEE, 1999, 87(2):223-233.
Van Berkel, K. et al., "Stretching quasi delay insensitivity by means of extended isochronic forks," In Proc. Int. Symp. Asynchronous Circuits and Systems, 1995, pp. 99-106.
Van Berkel, K. et al., "VLSI programming of asynchronous circuits for low power," Asynchronous Digital Circuit Design, 1995, pp. 151-210.
van Gageldonk, H. et al., "An Asynchronous Low-Power 80C51 Microcontroller," In Proc. ASYNC '98, 1998, pp. 1-12.
Williams, T.E. et al., "A Zero-Overhead Self-Timed 160-ns 54-b CMOS Divider," IEEE Journal of Solid-State Circuits. vol. 26, No. 11, Nov. 1991, pp. 1651-1661.
Zhou, Y. et al., "Cost-aware synthesis of asynchronous circuits based on partial acknowledgement," In Proc. IEEE/ACM Int. Conf Computer-Aided Design, 2006.

* cited by examiner

| 1-rail ($a_1$) | 0-rail ($a_0$) | 3NCL signal ($a$) |
|---|---|---|
| 313 — 0 | 313 — 0 | 313 — NULL |
| 314 — 0 | 314 — 1 | 314 — 0 |
| 315 — 1 | 315 — 0 | 315 — 1 |
| 316 — 1 | 316 — 1 | 316 — not allowed |

FIG. 3

$$g_{out}^0 = g_l^0 g_r^0 a_l^0 a_r^0 + g_l^1 g_r^0 a_l^0 a_r^0 + g_l^0 g_r^1 a_l^0 a_r^0 + g_l^1 g_r^1 a_l^0 a_r^1 + g_l^1 g_r^0 a_l^1 a_r^1$$

$$g_{out}^1 = g_l^1 g_r^1 a_l^1 a_r^0 + g_l^0 g_r^1 a_l^1 a_r^0 + g_l^1 g_r^0 a_l^0 a_r^1 + g_l^1 g_r^1 a_l^1 a_r^1$$

$$a_{out}^0 = g_l^0 a_l^0 a_r^0 + g_l^0 a_l^0 a_r^1 + g_l^1 a_l^0 a_r^0 + g_l^0 a_l^1 a_r^0 + g_l^1 a_l^1 a_r^0$$

$$a_{out}^1 = g_l^0 a_l^0 a_r^1 + g_l^1 a_l^0 a_r^1 + g_l^0 a_l^1 a_r^1 + g_l^1 a_l^1 a_r^1 + g_l^1 a_l^1 a_r^0$$

$$a_{out}^0 = a_l^1 a_r^1, \qquad a_{out}^1 = a_l^0 + a_r^0$$

2010

$$g_{out}^0 = g_l^1 a_l^0 a_r^0 g_r^1 + g_l^1 a_l^0 a_r^1 g_r^0 + g_l^1 a_l^1 g_r^0 + g_l^0 a_l^1 g_r^1$$
$$g_{out}^1 = g_l^0 a_l^0 a_r^0 g_r^0 + g_l^1 a_l^0 g_r^0 + g_l^0 a_l^1 g_r^1$$
$$a_{out}^0 = a_l^1 a_r^1$$
$$a_{out}^1 = a_l^0 a_r^0 + a_l^0 a_r^1 + a_l^1 a_r^0$$

METHODS, MEDIA, AND MEANS FOR FORMING ASYNCHRONOUS LOGIC NETWORKS

CROSS-REFERENCE TO RELATED APPLICATION

This application is a U.S. National Phase Application under 35 U.S.C. §371of International Patent Application No. PCT/US2007/012472, filed May 24, 2007, which claims the benefit under 35 U.S.C. §119(e) of U.S. Provisional Patent Application No. 60/808,308, filed May 24, 2006, and U.S. Provisional Patent Application No. 60/906,481, filed Mar. 12, 2007, each of which is hereby incorporated by reference herein in its entirety.

STATEMENT REGARDING GOVERNMENT SPONSORED RESEARCH

The invention disclosed herein was made with U.S. Government support from the DARPA CLASS Program and the NSF ITR under number NSF-CCR-0086036. Accordingly, the U.S. Government may have certain rights in this invention.

TECHNICAL FIELD

The disclosed subject matter relates to methods, media, and means for forming asynchronous logic networks.

BACKGROUND

A logic network can be represented, for example, as a directed acyclic graph of vertices and edges, where the vertices are partitioned into primary inputs, primary outputs, and internal vertices. A Boolean function can be associated with each internal vertex in a logic network. A Boolean function, $f$, with n inputs and m outputs can be defined as a mapping $f$: $B^n \rightarrow B^m$, where B can have the value 1 or 0. Input values of the logic network can be set on to the primary inputs and processed by the internal vertices. Calculated output values of the logic network can be produced at the primary outputs. Logic networks can be defined using various notations, such as, for example, using Boolean equations, hardware description languages, specifications, netlists, logic diagrams, and/or binary decisions diagrams.

The description of a logic network can be unbound (i.e., be technology-independent) or bound (i.e., be made of components that are instances of a given technology library). Typically, logic networks are first described using an unbound notation. However, for example, to actually make a digital circuit or test certain properties of a prospective digital circuit, the logic network typically needs to be bound to a given technology library. Technology mapping can transform an unbound logic network to a bound network. Various systems and methods exist to perform technology mapping and these systems and methods can be included in, for example, computer automated design (CAD) tools.

Challenges in designing and/or improving logic networks and/or circuits include, for example, reducing size, reducing area, and/or ensuring timing-robust implementations. However, in attempting to address some of these challenges, a circuit designer typically attempts to be careful to not introduce problems, such as, for example, timing hazards. Timing hazards can be caused by the timing delay of different components (e.g., logic gates, latches, multiplexers, etc.) in a circuit. When certain paths through a circuit allow a variable-change to propagate faster than other paths, a timing hazard may result. For example, if a logic gate accepts two inputs (e.g., input one and input two) and a new value for input one arrives before the corresponding new value for input two arrives, the gate output may change to reflect the arrival of input one, despite the fact that other gates leading to input two have not yet stabilized. As a result, the output of the logic gate will change before the entire sub-circuit leading to input two has stabilized. In this case, input two will not be observed by the gate, and later changes on input two may eventually cause incorrect values to appear on the gate output.

Logic networks and/or circuits can be designed to be, for example, asynchronous or synchronous. Unlike a synchronous circuit, an asynchronous circuit component is not governed by a clock circuit or global clock signal. Instead, the component waits for a signal or signals that indicate completion of instructions and operations. Circuits can be entirely asynchronous or entirely synchronous, while others can include both asynchronous and synchronous components and these components can communicate.

Avoiding and/or removing timing hazards can be a challenge in synchronous CAD flows, especially as, for example, process, temperature, and voltage variations increase in deep submicron designs. One approach to address this challenge present in synchronous designs is the use of asynchronous circuits that can accommodate timing discrepancies. Furthermore, asynchronous designs, as compared to synchronous designs, can reduce power consumption, reduce electromagnetic interference, improve robustness to parameter variations, and provide modularity of design.

One way of avoiding timing hazards in asynchronous logic networks is to ensure that the network is designed such that its output changes only after all its inputs have changed, such a network can be referred to as input-complete. An input-complete asynchronous logic network can be formed, for example, from a synchronous logic network, by replacing every logic gate in the synchronous logic network with an input-complete asynchronous block.

SUMMARY

Methods, media, and means for forming asynchronous logic networks are provided. In some embodiments, methods for forming an asynchronous logic network are provided. The methods include: receiving a logic network including vertices and signals, wherein the vertices include vertices with multiple output signals; determining a set of signals of the signals included in the logic network to be covered; selecting at least one vertex in the logic network to cover each signal in the set of signals; replacing the at least one selected vertex with a robust vertex; and replacing at least one non-selected vertex with a relaxed vertex.

In some embodiments, computer-readable media containing computer-executable instructions that, when executed by a processor, cause the processor to perform methods for forming an asynchronous logic network are provided. The methods include: receiving a logic network including vertices and signals, wherein the vertices include vertices with multiple output signals; determining a set of signals of the signals included in the logic network to be covered; selecting at least one vertex in the logic network to cover each signal in the set of signals; replacing the at least one selected vertex with a robust vertex; and replacing at least one non-selected vertex with a relaxed vertex.

In some embodiments, systems for forming an asynchronous logic network are provided. The systems include: means for receiving a logic network including vertices and signals, wherein the vertices include vertices with multiple output signals; means for determining a set of signals of the signals included in the logic network to be covered; means for selecting at least one vertex in the logic network to cover each signal in the set of signals; means for replacing the at least one selected vertex with a robust vertex; and means for replacing at least one non-selected vertex with a relaxed vertex.

BRIEF DESCRIPTION OF THE DRAWINGS

FIG. 3 is an illustration of 3NCL encoding that can be used in accordance with some embodiments of the disclosed subject matter.

FIG. 15A is an illustration of another implementation of the three-input, two-output block of FIG. 14 in accordance with some embodiments of the disclosed subject matter.

FIG. 16A is an illustration of another biased implementation of the three-input, two-output block of FIG. 14 in accordance with some embodiments of the disclosed subject matter.

FIG. 19 is an illustration of a robust implementation of a propagate/generate vertex of FIG. 13.

FIG. 20 is an illustration of the "a" output of a biased implementation of a propagate/generate vertex of FIG. 13 and an illustration a distributive implementation of a propagate/generate vertex of FIG. 13.

DETAILED DESCRIPTION

Methods, media, and systems for forming asynchronous logic networks are provided. A logic network can be, for example, a directed acyclic graph (G) containing vertices (V) connected by edges (E). Vertices can include, for example, primary inputs, primary outputs, and internal vertices. In some embodiments, each internal vertex can be associated with a Boolean function and can have one output edge which can be connected to other vertices. In other embodiments, each internal vertex can be associated with one or more Boolean functions and can have one or more output edge connected to other vertices. A vertex can be implemented as, for example, a logic gate (e.g., AND, OR, etc.) or a block of logic gates (e.g., an adder, a multiplexer, etc.). A synchronous logic network can be taken as input, the internal vertices of the network can be replaced with robust blocks (e.g., blocks that ensure timing hazard freedom, are input-complete, and/or are fully-expanded), and an asynchronous network can be produced as the output. In some embodiments, selected vertices can be replaced with robust blocks and non-selected vertices can be replaced with relaxed blocks (e.g., blocks that do not ensure timing hazard freedom and/or are input-incomplete) while still avoiding the introduction of timing hazards. Selection of which internal vertices to replace with robust blocks and which to replace with relaxed blocks can be based on, for example, cost functions that consider reducing and/or minimizing the number of vertices to be replaced with robust blocks, reducing and/or minimizing the area of the formed logic network, and/or reducing and/or minimizing delay through the formed logic network.

Figure 1:
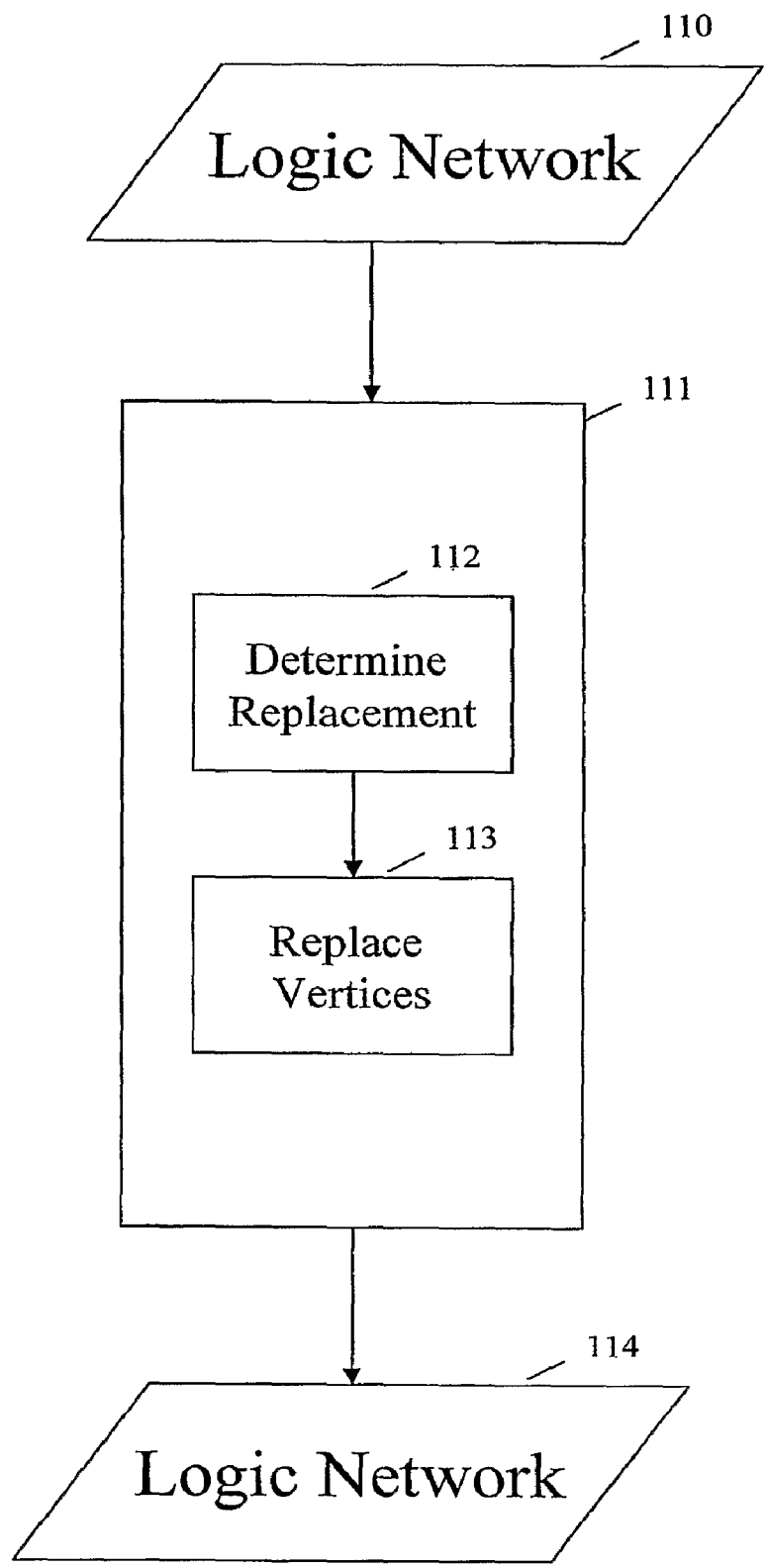
FIG. 1 is a simplified illustration of a method for forming an asynchronous logic network in accordance with some embodiments of the disclosed subject matter.

As shown in FIG. 1, some embodiments can process a logic network 110, at 111, where the vertices have single outputs (e.g., an AND gate with two inputs and one output), and produce an asynchronous logic network 114. Processing 111, can include, for example, determining, at 112, which vertices are to be replaced with robust blocks and which are to be replaced with relaxed blocks and replacing, at 113, the vertices with the selected blocks. Other embodiments can process logic network 110, at 111, where the vertices can have single and/or multiple outputs (e.g., a four-bit-input two-bit-output propagate/generate block), to produce a logic network 114. Logic network 110 can be, for example, a synchronous logic network, an asynchronous logic network, or a logic network that includes both synchronous and asynchronous components. Logic network 114 can be, for example, an asynchronous logic network, or a logic network that includes both synchronous and asynchronous components.

Figure 2:
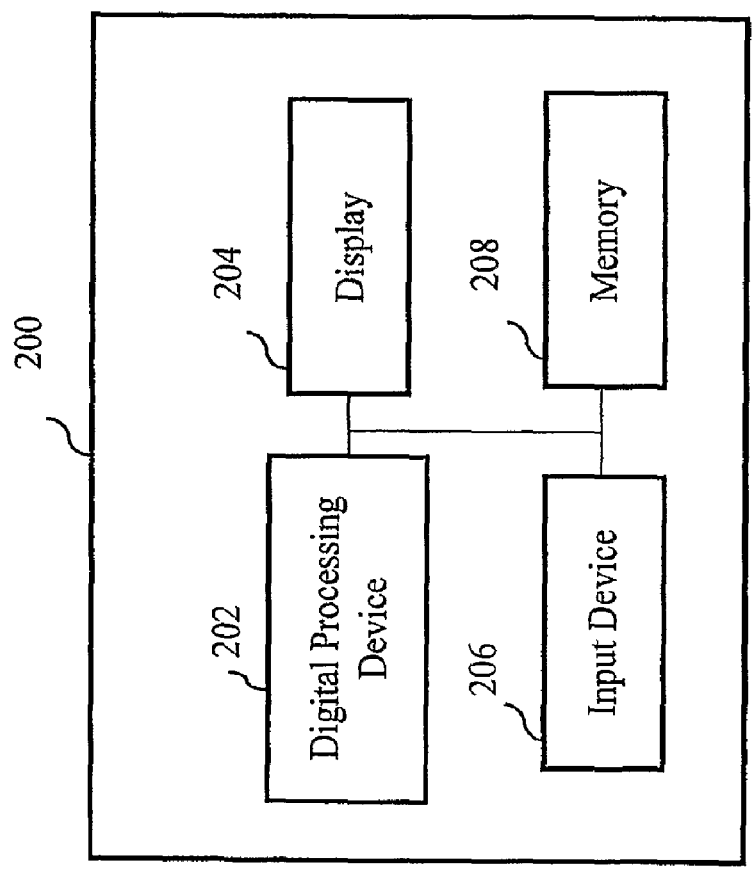
FIG. 2 is an illustration of a digital data processing device that can be used in accordance with some embodiments of the disclosed subject matter.

FIG. 2 illustrates a system 200 that can be used with some embodiments of the disclosed subject matter. System 200 can include, among other things, digital processing device 202, display 204, input device 206, and memory 208, which can be interconnected. Digital processing device 202 can be, for example, a processor, a digital signal processor, a controller, etc. In some embodiments, memory 208 contains a program for controlling digital processing device 202. Memory 208 can also contain applications for performing the methods described herein, for example, the method illustrated in FIG. 1. In some embodiments, various other applications can be resident in the memory 208. For example, the methods described herein can be integrated with CAD software, stored on memory 208, and executed by digital processing device 202. System 200 can include additional components, for example, additional input and/or output devices. Various systems 200 can be interconnected and/or connected with other devices.

In performing the methods disclosed herein, for example, the method of FIG. 1, various logic network implementation styles can be used. One of these implementation styles, Null Convention Logic (NCL), will now be discussed. NCL is a circuit implementation style for asynchronous threshold networks that uses delay insensitive encoding of a data-path in which data communication alternates between set and reset phases. In NCL, data can change from a spacer (called NULL) to a proper codeword (called DATA) in a set phase and change back to NULL in a reset phase.

Some embodiments of the disclosed subject matter can use a particular form of NCL called 3NCL, which is a three-valued logic with symbolic values {0, 1, N}. Of the three values, 0 and 1 represent valid data and N represents NULL. A 3NCL gate appears similar to a Boolean gate, but can alternate between set and reset phases. The input signals and the output signal of a 3NCL gate can be initialized to N. When all of the inputs have valid data values (i.e., 0 or 1), the output can change to a correct data value. For example, the output of a 3NCL OR gate changes to a 0 or 1 value only after all the inputs have changed to data values (i.e., 0 or 1). In the reset phase, the output of a 3NCL gate maintains its data value until all the inputs are reset to N, which causes the output to change to N.

A 3NCL circuit can be implemented using binary-valued Boolean circuits. For example, a 2NCL circuit, which can also be used in some embodiments, is a binary-valued implementation of a 3NCL circuit based on dual-rail encoding of 3NCL signals. Dual-rail encoding of each three-valued 3NCL signal can be achieved, for example, by using two 2NCL signals. Various encoding from 3NCL to 2NCL can be used. For example, FIG. 3 illustrates a table 310 describing one way in which 3NCL signals can be encoded to 2NCL signals. According to the mapping of table 310, if both the values of the 0-rail 311 and the 1-rail 312 are 0, the 3NCL value is NULL (i.e., invalid data), at row 313. If the value of the 0-rail 311 is 1 and the value of the 1-rail 312 is 0, the 3NCL value is 0, at row 314. If the value of the 0-rail 311 is 0 and value of the 1-rail 312 is 1, the 3NCL value is 1, at row 315. A value of 1, at row 316, on both the 0-rail 311 and the 1-rail 312 is not allowed.

Various systems and/or methods can be used to implement a 3NCL gate using dual-rail encoding, such as, for example, NCL-style expansion or Delay-Insensitive Minterm Synthesis (DIMS). With DIMS-style expansion, for example, each single variable (or bit) is mapped to a dual-rail Boolean equivalent and the Boolean function associated with the 3NCL gate is implemented as a network of complex minterms (e.g., C-elements, which are gates for which the output reflects the inputs when the states of all inputs match and where the output remains in that state until the inputs all transition to the other state) feeding into OR-gates for 0-rail and 1-rail outputs.

Figure 4:
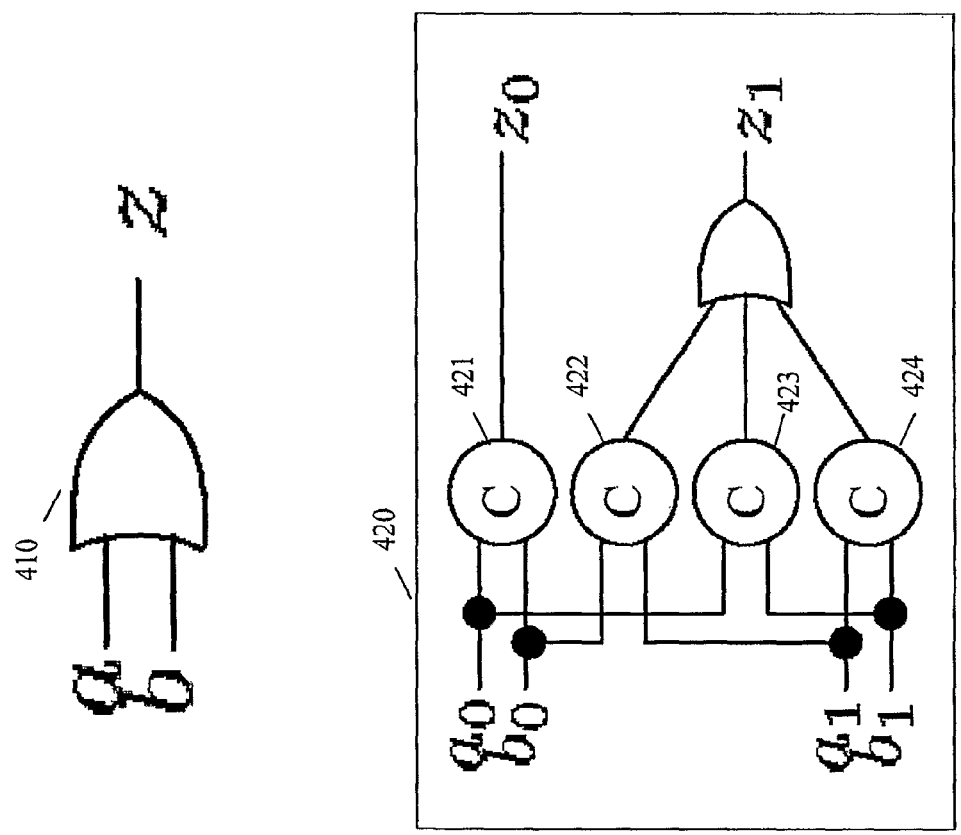
FIG. 4 is an illustration of a 3NCL gate expanded in a style that can be used in accordance with some embodiments of the disclosed subject matter

For example, FIG. 4 illustrates a 3NCL gate, 410, dual-rail expanded into a network of 2NCL gates in DIMS-style, at 420. In DIMS-style expansion, at 420, the two-input 3NCL OR gate 410, with inputs "a" and "b," and one output "z," is transformed into a network with four inputs, $a_0$, $a_1$, $b_0$, and $b_1$ and two outputs, $z_0$ and $z_1$. The wires $a_0$, $b_0$, $z_0$ represent the 0-rails of a, b, and z, and the wires $a_1$, $b_1$, and $z_1$, represent the 1-rails of a, b, and z. Each C-element 421-424 can detect a distinct input combination or minterm. A C-element is a logic gate with the property of hysteresis. The output of a C-element reflects the inputs when the states of all inputs match. The output of a C-element remains in this state until the inputs all transition to the other state.

One issue in designing and optimizing asynchronous threshold networks, for example, when using the method of FIG. 1, is avoiding timing hazards. For example, suppose an NCL circuit is in a reset state where all the wires have 0 values. Once all the input data arrives and all the circuit outputs are computed, in some embodiments, there must be at least one path from a primary input to a primary output where all the signal transitions are from 0 to 1. The events on each such path are an example of a signal transition sequence. A signal transition $s_2$ is said to acknowledge a signal transition $s_1$ if $s_1$ always precedes $s_2$ in any possible signal transition sequence in a set phase of an NCL circuit. In some embodiments, a signal transition is unacknowledged if it is not acknowledged by some signal transition on a primary output.

An unacknowledged signal transition sequence, which takes place after an output of a circuit has changed, can be referred to as an orphan. An orphan can arise when a signal transition on either a wire or a gate in the circuit is unobservable and may cause a circuit malfunction if, for example, the transition is too slow. Introduction of an orphan into a circuit can cause spurious signal transitions. For example, if an output of an NCL circuit changes as a result of a set of inputs, it may be assumed that the circuit is done responding to that set of inputs. As such, the circuit may enter a reset phase. However, if a signal is still propagating through the circuit while the circuit is in the reset phase, that signal many incorrectly cause an output to change during the reset phase or in the subsequent set phase. Orphans can include wire-orphans and gate-orphans. A wire-orphan is an unacknowledged signal transition sequence that does not run through a gate, and a gate-orphan is an unacknowledged signal transition sequence that runs through a gate. Processing 111 of FIG. 1, can transform, for example, a synchronous logic network 110 to an asynchronous logic network 114 without introducing gate orphans.

Figure 5:
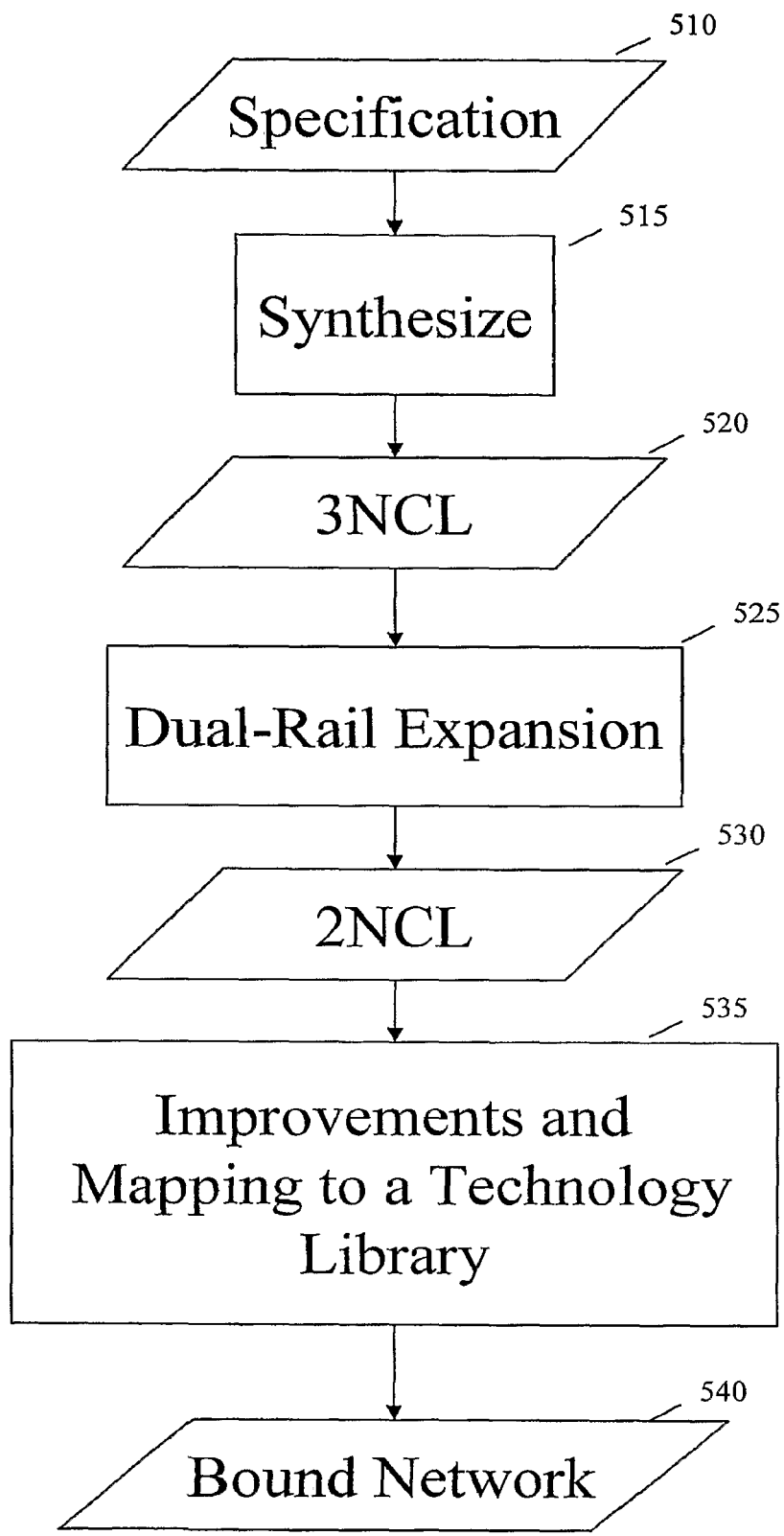
FIG. 5 is an illustration of an NCL synthesis method that can be used in accordance with some embodiments of the disclosed subject matter.

Some embodiments of the disclosed subject matter are applicable to various asynchronous threshold circuit and/or synthesis flow. For example, some embodiments can function with the NCL synthesis illustrated in FIG. 5. A specification 510 can be created, for example, using a hardware description language, such as Very High Speed Integrated Circuit Hardware Description Language (VHDL) or Verilog. The specification 510 can be transformed to a network of logic gates and optimized and/or improved, at 515, using various systems and/or methods, such as, for example, CAD tools, such as the Synopsys Design Compiler. The result can be a 3NCL circuit 520, that is, for example, optimized and/or improved. While performing these optimizations and/or improvements, the 3NCL circuit can be treated as a standard Boolean circuit by CAD tools.

Some embodiments can replace the 3NCL gates (or blocks of gates) in the 3NCL circuit 520 with dual-rail blocks, at 525, to create a 2NCL circuit 530. For example, processing 111 of FIG. 1 can include dual-rail expansion 525 and 3NCL logic network 520 can be inputted as logic network 111. However, logic networks at various levels of implementation can be used as logic network 111, for example, specification 510, 3NCL logic network 520, or 2NCL logic network 530 can be logic network 111. Further processing, for example, at 535, can be used to merge vertices and/or map the 2NCL logic network 530 to a bound logic network 540. The methods, media, and/or systems of the disclosed subject matter can be used in combination with, for example, the methods, media, and/or systems described in U.S. patent application Ser. No. 11/701,868, filed Feb. 1, 2007 (hereinafter, "the '868 application"), which is hereby incorporated by reference herein in its entirety. For example, logic network 114 of FIG. 1 can be transformed to a bound logic network 540 using the methods, media and/or systems described in the '868 application. Logic network 540 can be used to manufacture a physical circuit.

Figure 6:
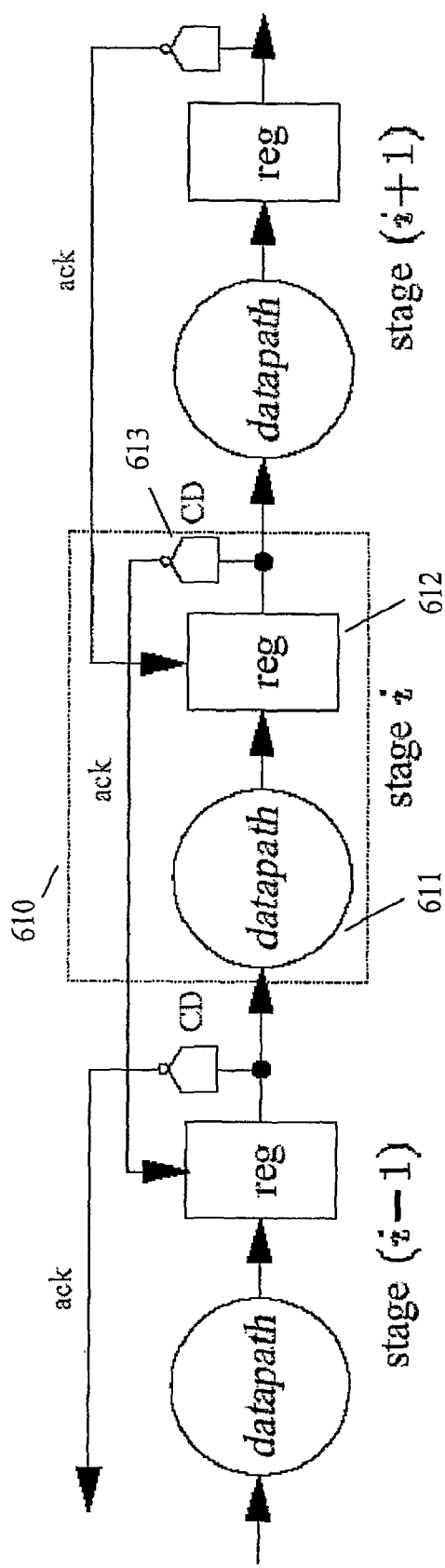
FIG. 6 is an illustration of a portion of an NCL circuit with three pipeline stages that can be used in accordance with some embodiments of the disclosed subject matter.

In some embodiments, NCL circuits can be implemented as pipelined circuits where, for example, pipeline stages communicate using a four-phase signaling protocol. FIG. 6 illustrates a portion of an NCL circuit with three pipeline stages. Box 610 represents a single pipeline stage having three components: datapath 611, registers 612, and a completion detector 613. Datapath component 611 can perform computation. Register component 612 can store results of the computation and synchronize data flow between pipeline stages. Completion detector component 613 can detect the completion of computation and can send an acknowledgement signal to a previous stage.

Figure 7:
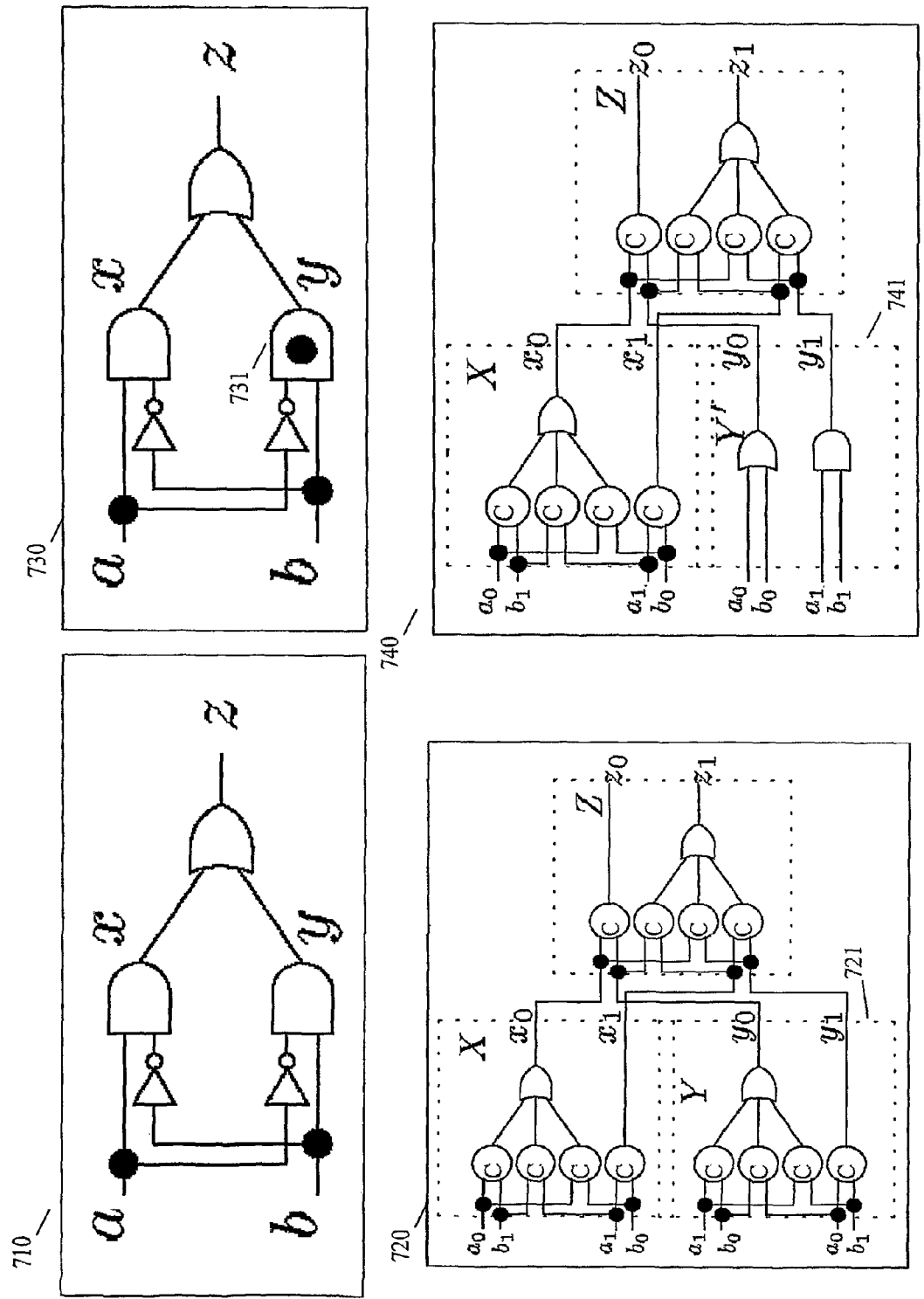
FIG. 7 is an illustration of a various implementations of an XOR network that can be used in accordance with some embodiments of the disclosed subject matter.

FIG. 7 illustrates a 3NCL network 710 that computes the exclusive-or (XOR) of inputs 'a' and 'b'. Logic network 710 can be generated, for example, at 515, of FIG. 5. Some embodiments can transform network 710 into a dual-rail expansion 720. This transformation can be done, for example, at 113 of FIG. 1, where network 710 is a part of or all of logic network 110. The dual-rail blocks X, Y, and Z of 720 correspond to vertices x, y, and z of 710. Suppose, for example, that initially the dual-rail network 720 is in a reset state with the wires initialized to '0.' The dual-rail blocks X and Y ensure that the node output signals x and y make transitions only after signals a and b have arrived. The dual-rail block Z ensures that primary output signal z makes transitions only after internal signals x and y make transitions.

However, dual-rail network 720 is overly restrictive. Accordingly, instead of replacing each vertex of network 710 with a robust block, the method of FIG. 1 can be used to replace only select vertices with robust blocks. For example, signals 'a' and 'b' are each acknowledged on two distinct paths: through node x and through node y. Similarly, in 720, the dual-rail inputs 'a' and 'b' are each acknowledged through two input-complete blocks X and Y. Accordingly, some embodiments can flag, at 112 of FIG. 1, AND 731 to be relaxed and implement AND 731 using an input-incomplete implementation Y' 741. Accordingly, network 741 can replace network 721 to form network 740, which avoids the introduction of timing-hazards, while being smaller than 720.

Figure 8:
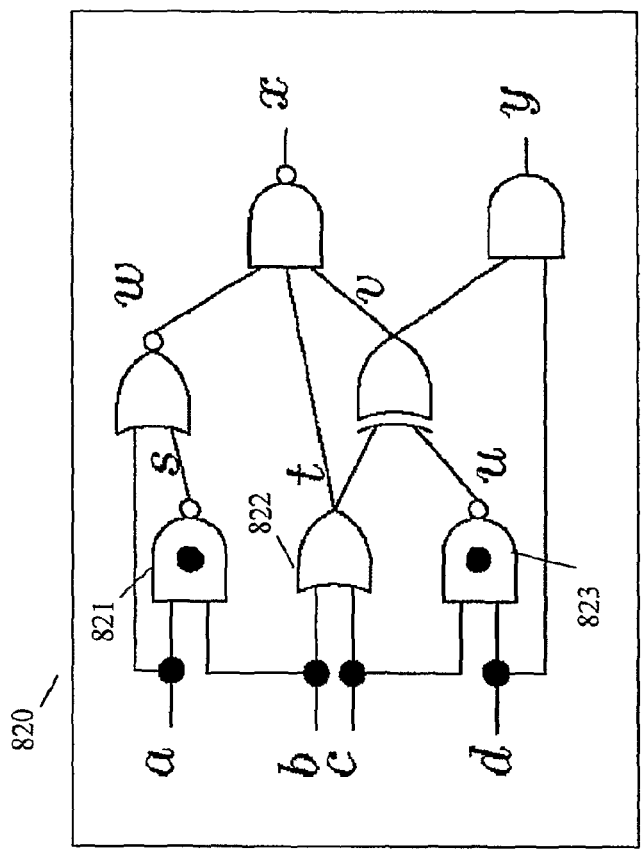
FIG. 8 is an illustration of two options for relaxing vertices in accordance with some embodiments of the disclosed subject matter.
Figure 8:
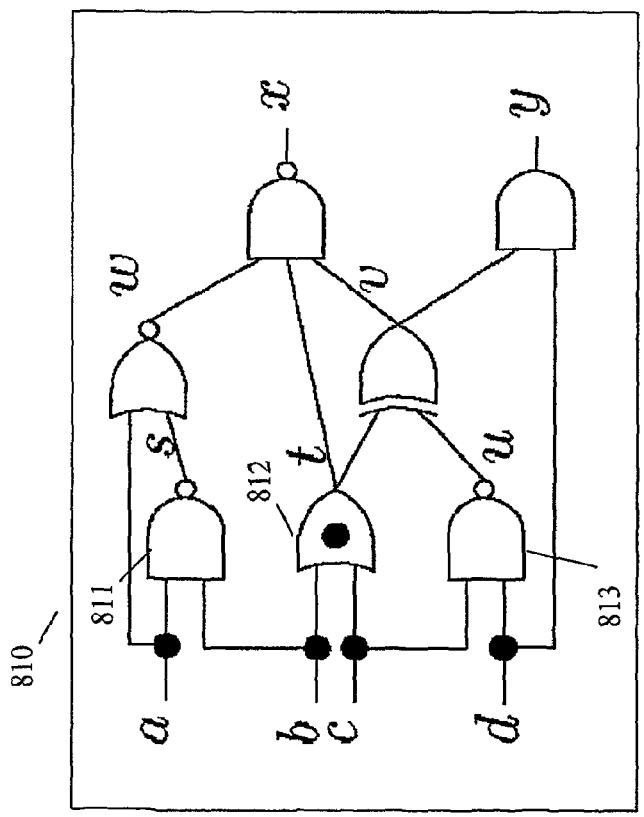

In some logic networks there can be various choices, at 112 of FIG. 1, of which vertices (e.g., 3NCL gates) to replace with relaxed implementations and/or which to replace with robust implementations, at 113. FIG. 8 illustrates two 3NCL networks with different decisions of which vertices to relax, the selected vertices are marked with bullets. In network 810 one vertex "t" 811 is relaxed. In network 820, two vertices, "s" 821 and "u" 822 are relaxed. The decision of which vertices to relax can depend on, for example, which vertices will be used to ensure robustness to input signals (e.g., signals "b" and "c"). For example, in 810, vertices 811 and 813 are fully-expanded and cover signals "b" and "c". In 820, vertex 822 is fully-expanded and covers signals 'b' and 'c'. Deciding which vertices to relax can also depend on a cost function, such as, for example, reducing area, delay, or power consumption.

Figure 9:
FIG. 9 is a table containing illustrations of various 3NCL gates and possible robust and relaxed implementations in accordance with some embodiments of the disclosed subject matter.

FIG. 9 illustrates a table 910 which includes examples of how 3NCL gates can be transformed to 2NCL dual-rail blocks, at, for example, 113 of FIG. 1. Column 911 illustrates a 3NCL inverter as well as three two-input 3NCL gates. Columns 912 and 913 illustrate possible dual-rail implementations of the 3NCL gates of column 911, with 912 being robust and 913 being relaxed. Dual-rail expansion is also possible for gates with, for example, more than two inputs (i.e., two input gates are used only as an example).

Figure 10:
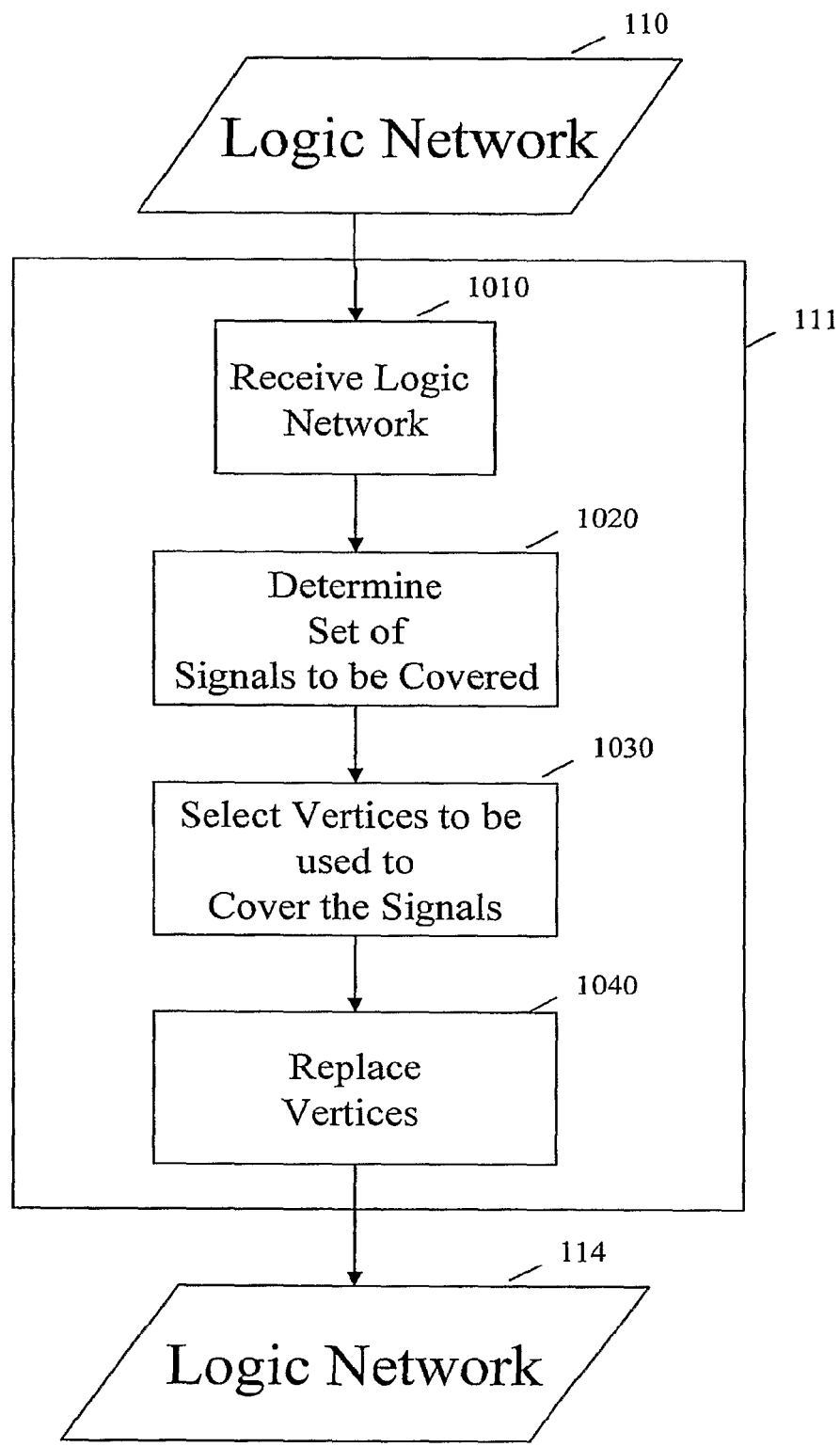
FIG. 10 is a simplified illustration of a method for forming an asynchronous logic network in accordance with some embodiments of the disclosed subject matter.

FIG. 10 illustrates a more detailed embodiment of the method of FIG. 1. As illustrated in FIG. 10, some embodiments can receive, at 1010, a logic network 110. A set of signals to be covered can be determined, at 1020. This set of signals can include, for example, primary input signals and internal vertex output signals. Vertices can be selected, at 1030, such that for each signal in the set of signals there is at least one selected vertex that covers that signal. The selected vertices can be replaced, at 1040 with vertices that ensure input completeness in at least one phase (e.g., one of the "set" or "reset" phases) and the non-selected vertices can be replaced, also at 1040, with relaxed vertices. To provided robustness, each phase of each primary input signal and internal gate output signal can be covered. In some embodiments, a vertex covers a signal if the signal is an input to the vertex and thus the vertex can provide robustness in both the set phase and reset phase. In other embodiments, a vertex covers a signal if the vertex provides robustness in at least one of the set phase and reset phase.

In some cases, a signal can be covered by more than one vertex. In such cases, some embodiments can consider, for example, various cost functions in determining which vertices to select, at 1030. This can be done, for example, by assigning weights to vertices in the logic network 110. For example, a vertex can be assigned a weight that is equal to the difference in area between a robust (e.g. fully-expanded) implementation of the vertex and a relaxed implementation of the vertex (e.g., the area occupied by implementation 915 of FIG. 9 minus the area occupied by implementation 916). Weights can also be based on power consumption. For example, a vertex can be assigned a weight that is equal to the difference in power consumption values between a robust (e.g. fully-expanded) implementation of the vertex and a relaxed implementation of the vertex. In another example, vertices on a critical path in a fully-expanded implementation of the logic network 110 can be given low weights while vertices which are not on a critical path can be assigned high weights. These weights can then be used in deciding which vertex should be used to cover which signal.

In transforming a logic network at 110, some embodiments can solve a unate covering problem (UCP). For example, given a finite set of elements U and collection C of subsets of U, some embodiments can find a minimum cardinality subset $C' \subseteq C$ which covers U (i.e., $\cup_{Ci \in C} Ci = U$). A UCP can be extended with a weight function $w: C \to R^+$ which assigns a weight to each subset of U in C. For such a weighted UCP, some embodiments can find, for example, a subset $C' \subseteq C$ such that $\Sigma C_{i \in C'} w(C_i)$ is the minimum. A UCP instance can be denoted by (U,C) and a weighted UCP instance can be denoted (U,C,w). A UCP can also be formed, for example, in table (e.g., constraint matrix) form. For example, M can be a matrix of m rows and n columns, for which $M_{ij}$ is either 0 or 1. The rows can represent signals to be covered (e.g., internal gate outputs and primary inputs) and the columns can represent vertices which can be used to cover the signals. In such a form, the UCP is the problem of finding a minimum cardinality subset of columns that cover M. That is, every row of M contains a 1-entry in at least one of the columns of the subset of columns used to cover M and there is no smaller set of columns which also covers M. In some embodiments, however, a solution for covering M can be chosen which is not based solely on reducing and/or minimizing the number of columns used to cover M. Instead, the selection of columns can additionally depend on various cost functions that can be repressed by associating weights with various columns (the weights can be determined, for example, as described above). For example, in some networks choosing the minimum number of columns can result in circuit with a larger area than other solutions. A UCP can be solved using various systems and/or methods, such as, for example, heuristic methods, exact methods, brute-force methods, and/or a Branch-and-Bound Algorithm.

Some embodiments can base the decision, of which vertices to replace, at 1030 of FIG. 10, with robust blocks and which to replace, at 1040, with relaxed blocks on reducing and/or minimizing the number of robust blocks. For example, a set U can be defined to be the set of 3NCL primary input signals and gate output signals. In such embodiments, a 3NCL gate, $v \in V$, covers a signal u in U exactly when the given signal is an input to the gate v. Accordingly, the collection C of subsets of U can be formed as $C=\{C_v: v \in V$ and $C_v=\{u \in U: v$ covers $u\}\}$, where a gate v is defined to cover u when signal u is fed as an input to gate v. For example, where network 110 is a 3NCL netlist G=(V,E), determining, at 112, can be based on the results of a solution to a UCP defined as $(U, \{C_v: v \in V\})$. A solution to this UCP can be a subset $V' \subseteq V$ of 3NCL gates which are replaced, at 113, by robust 2NCL blocks. Remaining gates can be replaced with relaxed implementations.

Other embodiments can base the decision, at 1030, of which vertices to replace, at 1040, with robust blocks and which to replace, at 1040, with relaxed blocks on reducing and/or minimizing the area of the resulting logic network. The selection of which vertices to replace with robust blocks or relaxed blocks can then be based on, for example, the known areas of the 2NCL gates. Such embodiments can, for example, use a weighted UCP. A weight function can be defined for the 3NCL gates such that the weight of a 3NCL gate conveys information on the area that the gate will require after it is fully expanded. For example, such a weight function can be defined as weight(v)=full_area(v)−relaxed_area(v) where full_area(v) is the area of the dual-rail implementation of a 3NCL gate v without relaxation and relaxed_area(v) is the area of the relaxed dual-rail implementation. The weight (v), therefore, represents the penalty of using the full expansion versus the relaxed expansion. Such weights can also be assigned based on power consumption. For example, where network 110 is a 3NCL netlist G=(V,E), determining, at 112, can be based on the results of a solution to a weighted UCP defined as $(U, \{C_v: v \in V\}, w)$. A solution to this UCP can be, for example, a subset of 3NCL gates in V with the reduced and/or minimum sum of weights (and therefore area) which are replaced, at 113, by fully expanded 2NCL networks. Any remaining gates can be replaced with relaxed implementations.

Still other embodiments can base the decision, at 1030, of which vertices to replace, at 1030, with robust blocks and which to replace, at 1040, with relaxed blocks on reducing and/or minimizing the critical path delay through the logic network. Such embodiments can, for example, use a weighted UCP where weights are assigned such that relaxation of gates is biased towards the gates in critical paths. To determine the critical path of a 3NCL network G, G can be expanded into a 2NCL network G' of robust blocks. The path or paths with the worst-case delay can be identified. The vertices of G which correspond to the critical path vertices of G' can be identified and marked as critical. Higher weights can be assigned to critical vertices to increase the likely hood that non-critical vertices will be picked for replacement with relaxed blocks.

Some embodiments can combine and/or select among various cost functions. For example, portions of logic network 110 which are considered timing critical can be processed with weights assigned based on path delay and/or power consumption while portions of the network that are not timing critical can be processed with weights assigned based on area or on using the minimum number of fully robust gates. Other embodiments can process a logic network 110 multiple times using various cost functions and then select among various produced logic networks 114.

In some embodiments, input completeness of a single signal can be ensured by one path in the set phase and another path in the reset phase. Doing so can allow greater flexibility in relaxing the replacement, at 113, of vertices. Such embodiments can base replacement on, for example, binate covering problems. For a single signal s, two elements can be created and added to U: $s^{set}$ and $s^{reset}$. When a covering set $C_v$ covers $s^{set}$, selection of $C_v$ ensures robustness of signal s in the set phase after robust expansion. When a covering set $C_u$ covers $s^{reset}$, robust expansion of $C_u$ ensures robustness of signal s with respect to the reset phase.

Figure 11:
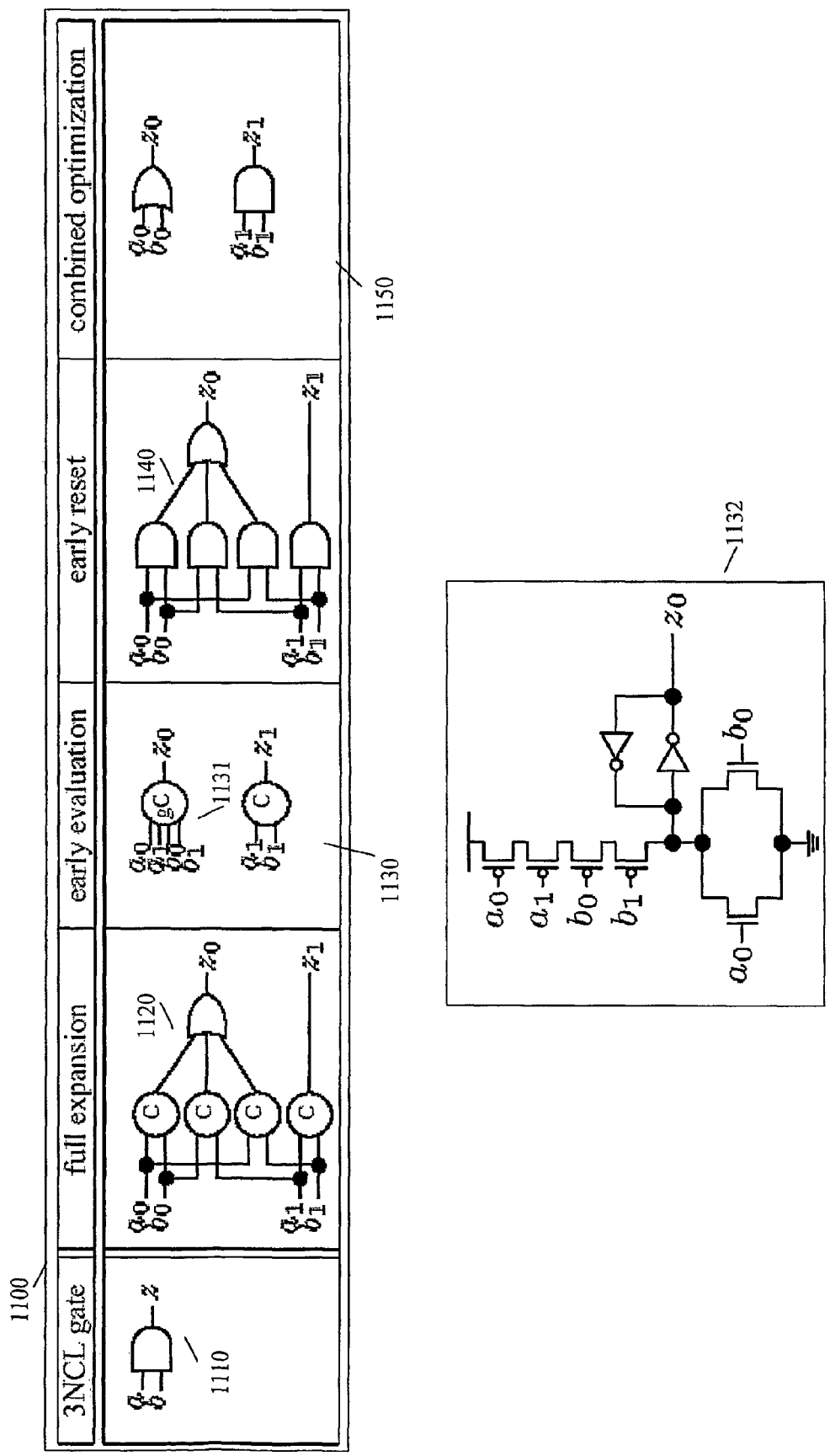
FIG. 11 a table containing illustrations of a 3NCL gate and various implementations of that 3NCL gate in accordance with some embodiments of the disclosed subject matter.

As illustrated in table 1100 of FIG. 11 a two-input 3NCL gate 1110 can be expanded, for example, into one of four different dual-rail blocks (1120-1150). Two of these expansions, 120 and 1150 also appear in FIG. 9. Returning to FIG. 11, one possibility 1120 is a fully-expanded dual-rail block that ensures timing robustness in both set and reset phases. Another possibility 1130 is an eager-evaluating block that ensures robustness in the reset phase (an implementation of the generalized C element 1131 is shown at 1132). A third possibility 1140 is an eager-resetting block that ensures robustness in the set phase. A fourth possibility 1150 is a relaxed dual-rail implementation that does not provide robustness in either phase. Various implementations (e.g., 1120-1150) can be selected, at 112, to replace, at 113, the vertices of network 110 to form network 114.

In selecting among various possible replacements (e.g., 1120-1150) only one of 1120-1150 can be selected to replace a specific vertex 1110. For example, if an early evaluation network 1130 is selected to replace a vertex 1110, an early reset network 1140 cannot also be selected to replace that vertex 1110. In some embodiments, to formulate a relaxation problem when separate covering is allowed for set and reset phases (e.g., by replacing vertices with early evaluation and early reset networks), a binate covering problem instance can be used. For each 3NCL gate $v \in V$, three covering sets, $C_v^{set}$, $C_v^{reset}$, $C_v^{both}$, can be created and added to C. $C_v^{reset}$ can provide robustness in reset phases, $C_v^{set}$ can provide robustness in set phases, and $C_v^{both}$ can provide robustness in both set and reset phases. Given that $\{s_1, \ldots, S_k\}$ are 3NCL signals that are inputs to the gate v, $C_v^{set} = \{s_1^{set}, \ldots, s_k^{set}\}$, $C_v^{reset} = \{s_1^{reset}, \ldots, s_k^{reset}\}$, $C_v^{both} = C_v^{set} \cup C_v^{reset}$.

The covering problem instance can be given as:

$U = \{s^{set}, s^{reset} : \text{signal s in G}\}$, $C = \{C_v^{set}, C_v^{reset}, C_v^{both} : \text{gate } v \in V\}$.

In some embodiments, binate constraints can be added so that $C_v^{set}$, $C_v^{reset}$, $C_v^{both}$ are picked in a mutually exclusive manner. For example, for each 3NCL gate v, a binate constraint can be added as: $\overline{(C_v^{set} + C_v^{reset})} \overline{(C_v^{set} + C_v^{both})} \overline{(C_v^{reset} + C_v^{both})}$. The first clause indicates that if an early reset covering set is selected, then an early evaluation covering set cannot be selected and vice versa. The second clause indicates that if an early rest covering set is selected, then a fully expanded covering set cannot be selected and vice versa. The third clause indicates that if an early evaluation covering set is selected, then a fully expanded covering set cannot be selected and vice versa.

Figure 12:
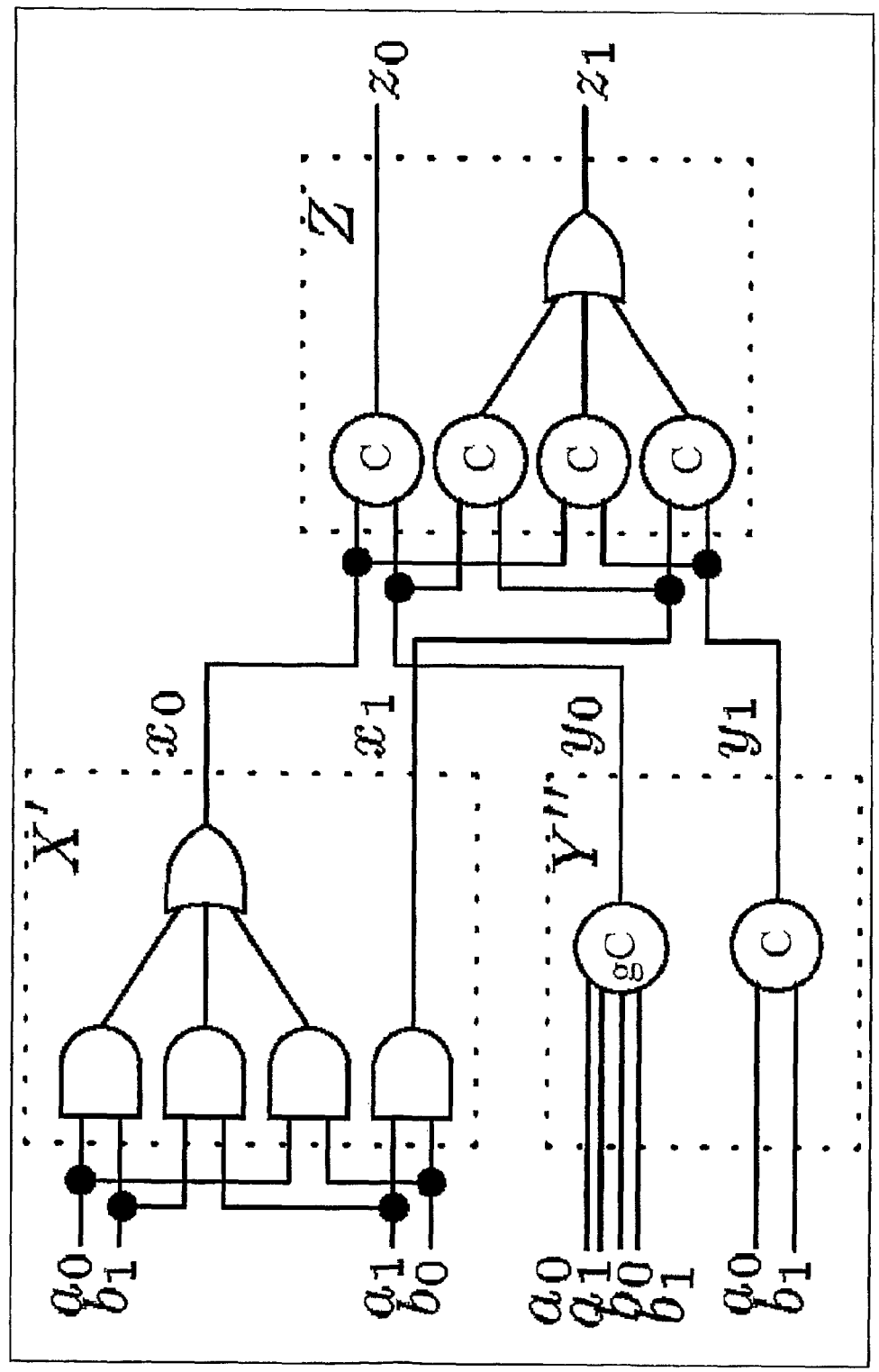
FIG. 12 is another illustration of an implementation of an XOR network that can be used in accordance with some embodiments of the disclosed subject matter.

FIG. 12 illustrates a relaxed dual-rail circuit equivalent to logic network 710 of FIG. 7. The dual-rail block X' ensures robustness to signals "a" and "b" in the set phases and block Y" ensures robustness in the reset phases to signals "a" and "b."

As discussed above in reference to FIG. 1, some embodiments can process logic network 110, at 111, where the vertices of the network can have single and/or multiple outputs, to produce a logic network 114. Logic networks where all vertices have only one output can be referred to as gate-level networks. Logic networks where the vertices can have multiple outputs can be referred to as block-level networks. Vertices which are to be replaced, at 113, in a non-relaxed manner can be differentiated, at 112, (e.g., by flagging them) from vertices that are to replaced, at 113, in a relaxed manner. The relaxed vertices can be mapped to, for example, an eager implementation and the non-relaxed vertices can be implemented based on a cost function (e.g., reducing area, reducing delay, etc.).

Figure 13:
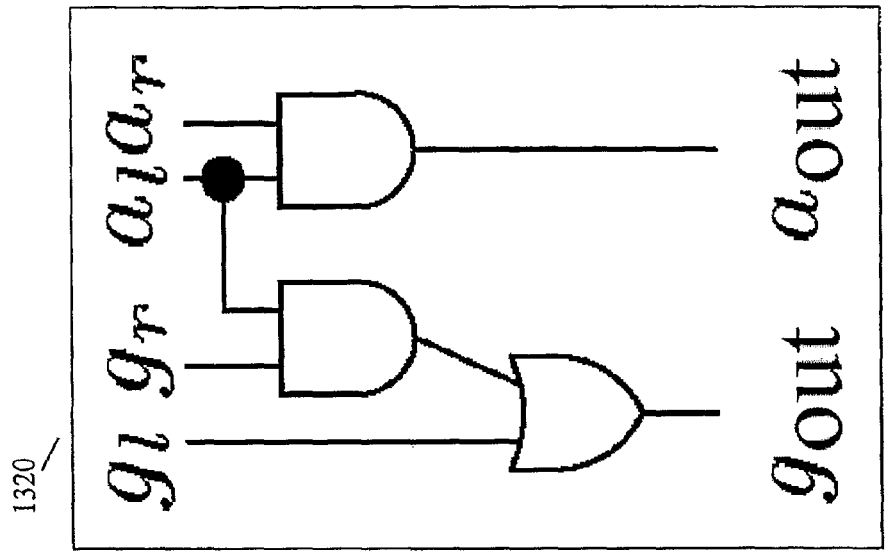
FIG. 13 is an illustration of two implementations of a propagate/generate vertex that can be used in accordance with some embodiments of the disclosed subject matter.
Figure 13:
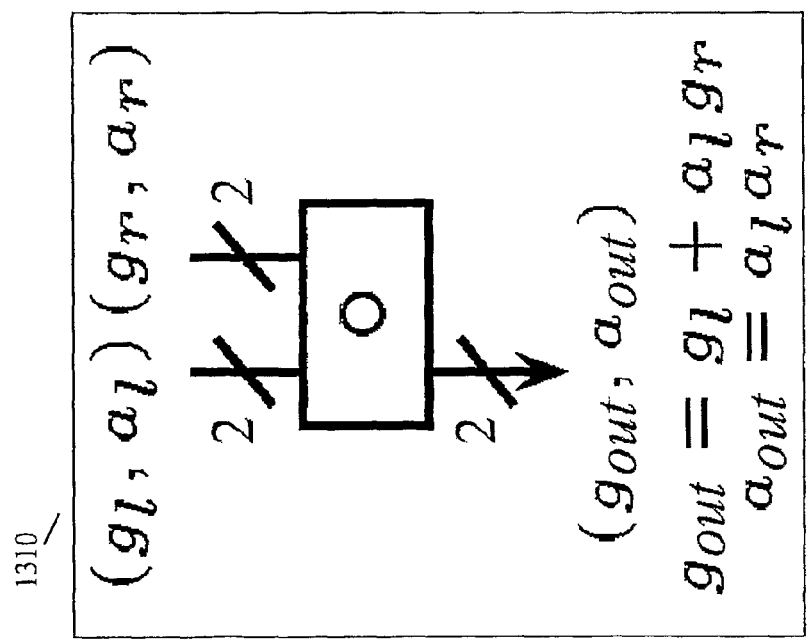

In some embodiments, a logic network 110 can be considered to be either a gate-level network or a block-level network depending on, for example, where boundaries between the various vertices are drawn. In other embodiments, for example, a specification can describe a logic network 110 as either a gate-level network or a block-level network. Looking at a logic network as a block-level network can provide advantages over looking at the network as a gate-level network Referring to FIG. 13, a parallel prefix adder can be specified as a block level network using multiple instances of block 1310 structured in a tree form or as a gate-level network using primitive gates such as AND, OR, and, INVERTER (as in network 1320, which is the gate-level equivalent of block 1310). It is also possible that logic network 110 can be described and/or processed (e.g., at 111 of FIG. 10) where parts of logic network 110 are block-level and parts are gate-level.

Figure 14:
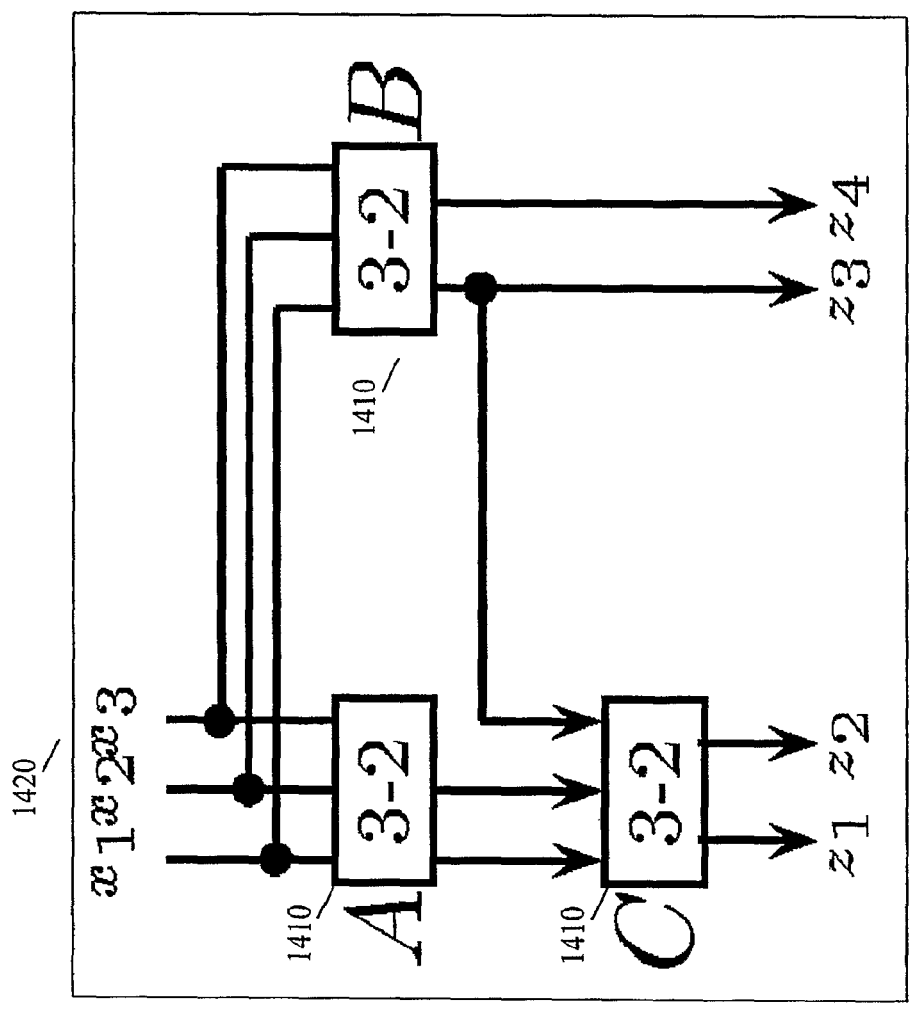
FIG. 14 is an illustration of a three-input, two-output block and a network of three-input, two-output blocks that can be used in accordance with some embodiments of the disclosed subject matter.
Figure 14:
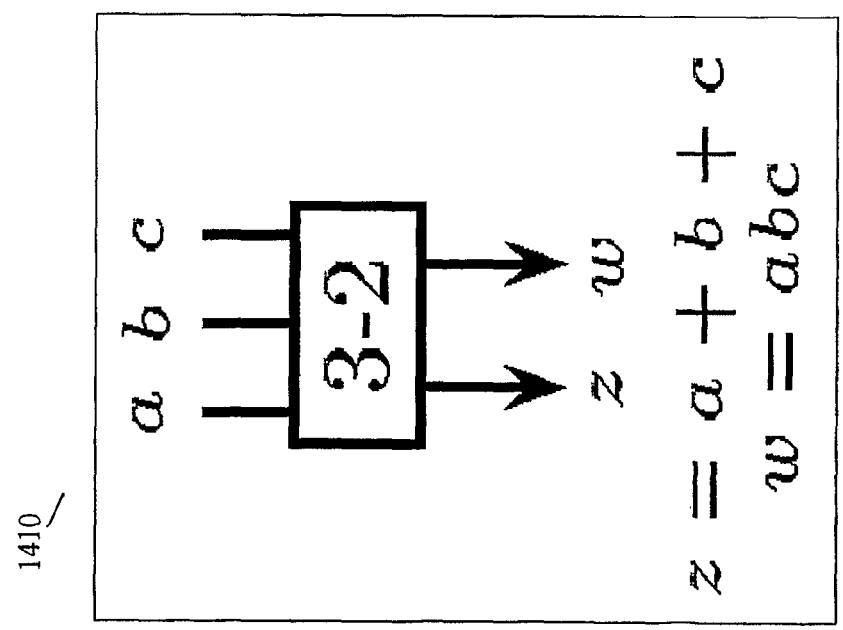
Figure 15:
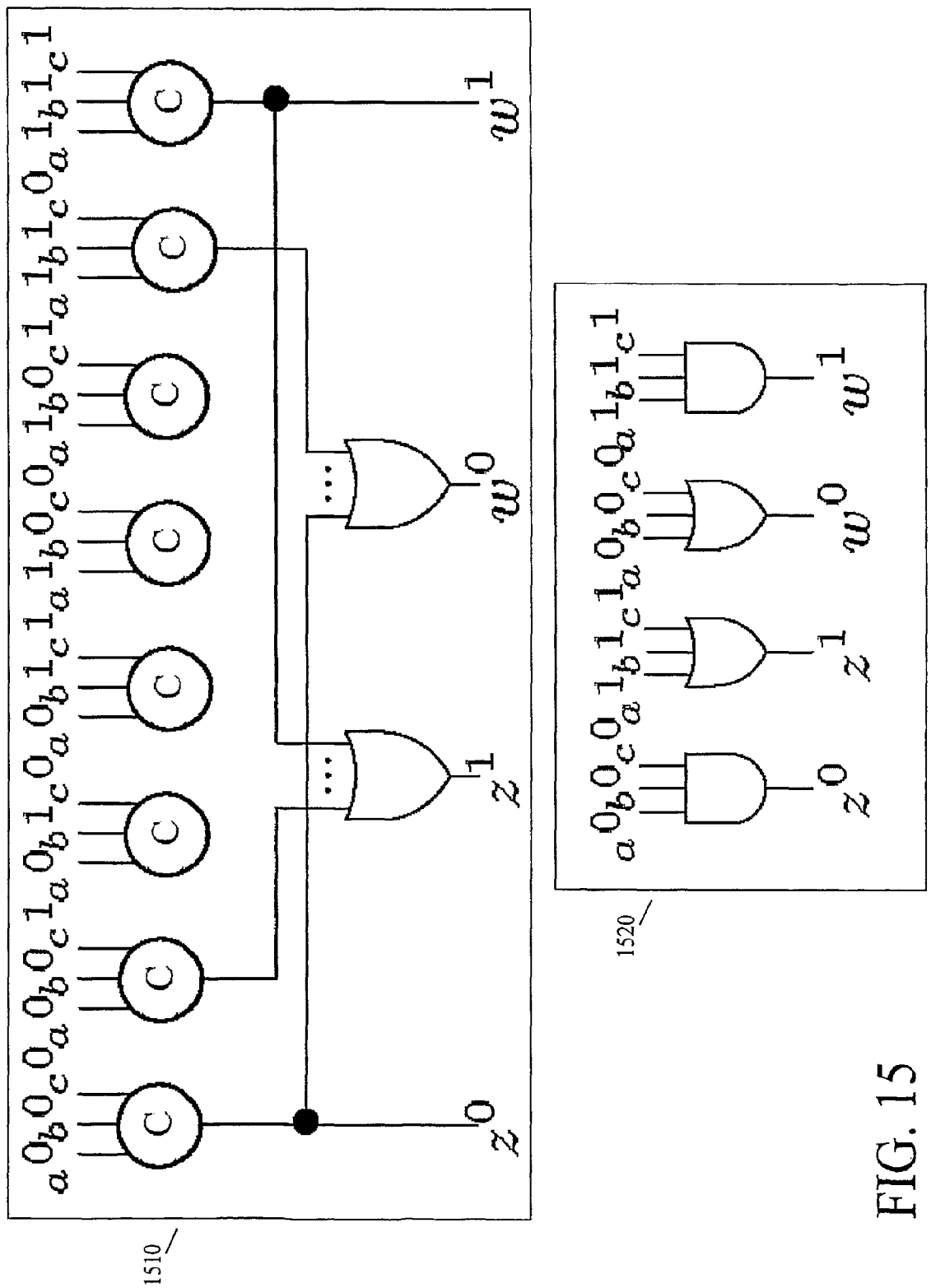
FIG. 15 is an illustration of two implementations of the three-input, two-output block of FIG. 14 in accordance with some embodiments of the disclosed subject matter.
Figure 15:
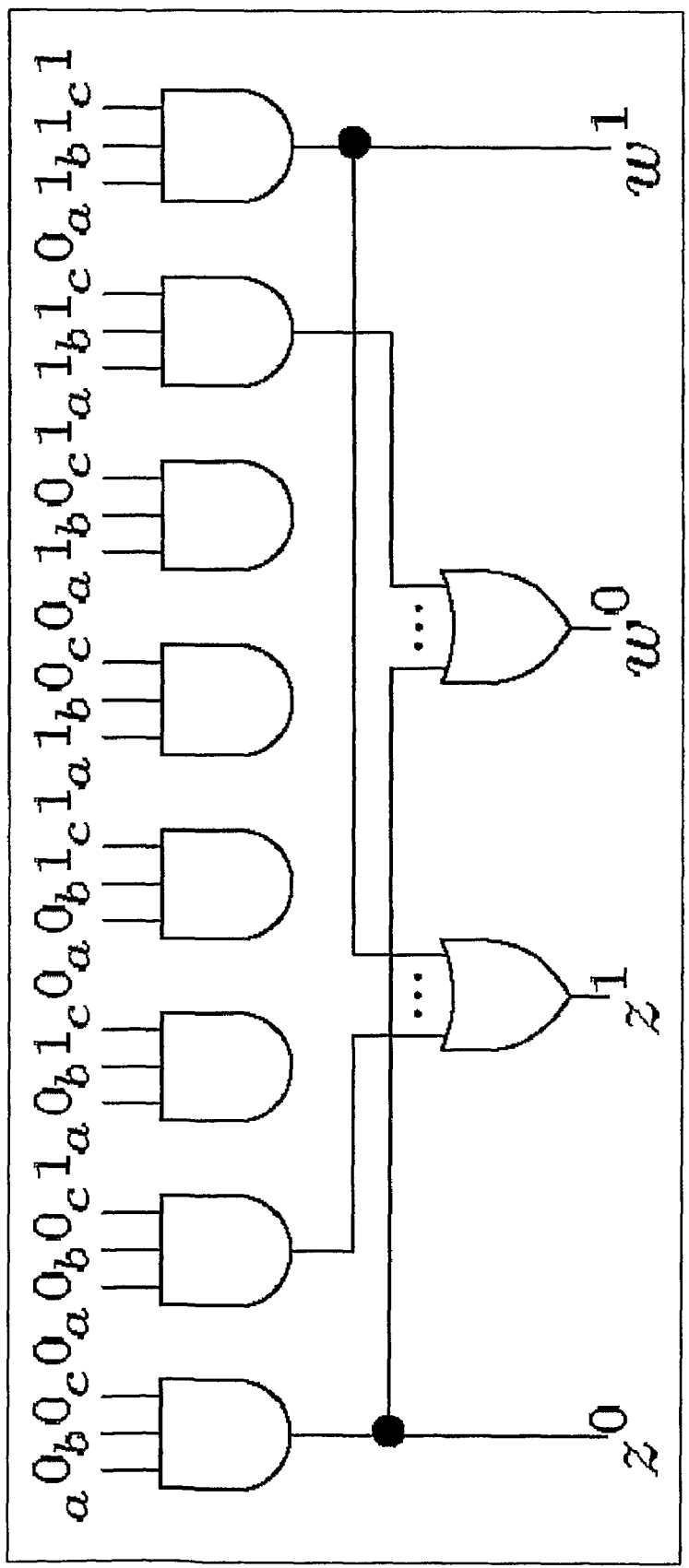

FIG. 14 illustrates a 3-2 block (i.e., having 3 inputs, 2 outputs) 1410 and a network 1420 of three 3-2 blocks 1410. Some embodiments can implement a vertex 1410 as either fully-relaxed (e.g., no input completeness required for the block) or basic-input-complete (e.g., input completeness required for every output of the block). The 3NCL block-level network 1420 has three primary inputs, $x_1$, $x_2$, and $x_3$, and four primary outputs $z_1$, $z_2$, $z_3$, and $z_4$. In this network, the three primary input signals are covered by both blocks A and B. Only one of block A and block B needs to be input-complete; the other can be relaxed. For example, assume A is relaxed and B is input-complete. In such an example, C must also be input-complete because A must be covered. FIG. 15 illustrates a basic-input-complete (i.e. robust) implementation 1510 of the 3-2 block 1410. Also illustrated, is a fully relaxed implementation 1520.

Figure 16:
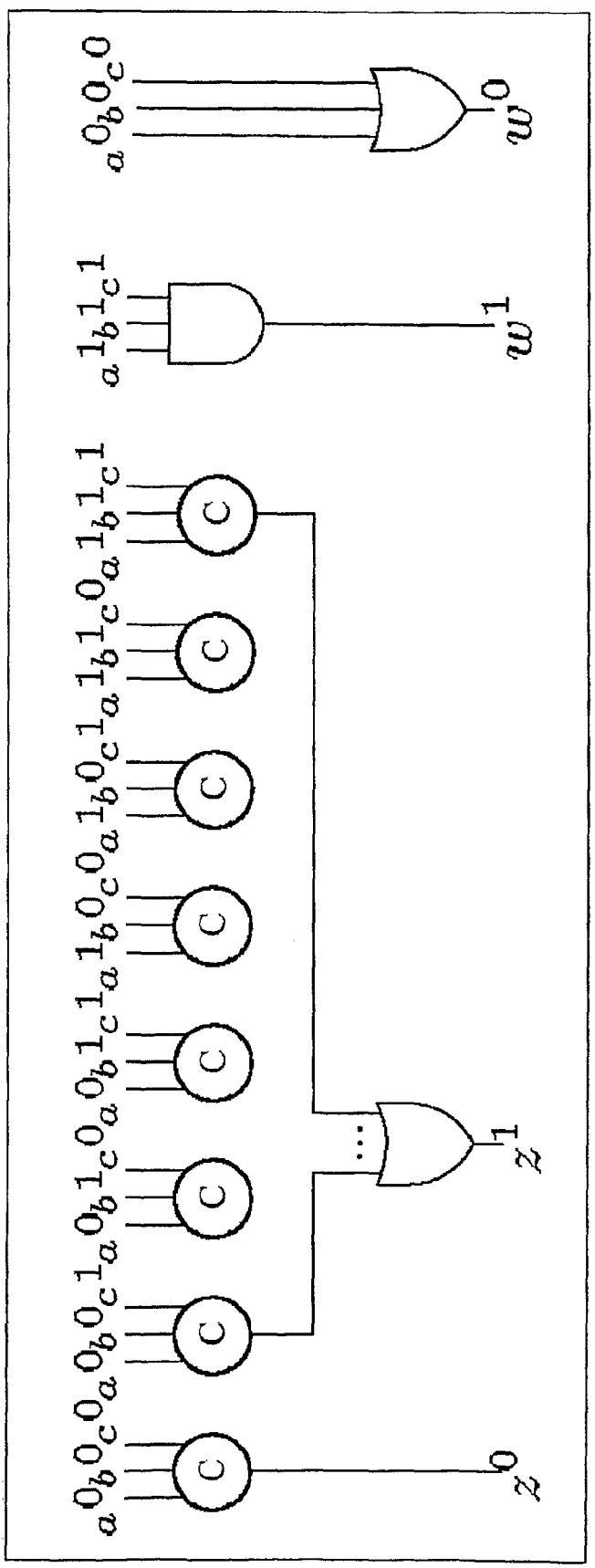
FIG. 16 is an illustration of a biased implementation of the three-input, two-output block of FIG. 14 in accordance with some embodiments of the disclosed subject matter.
Figure 16:
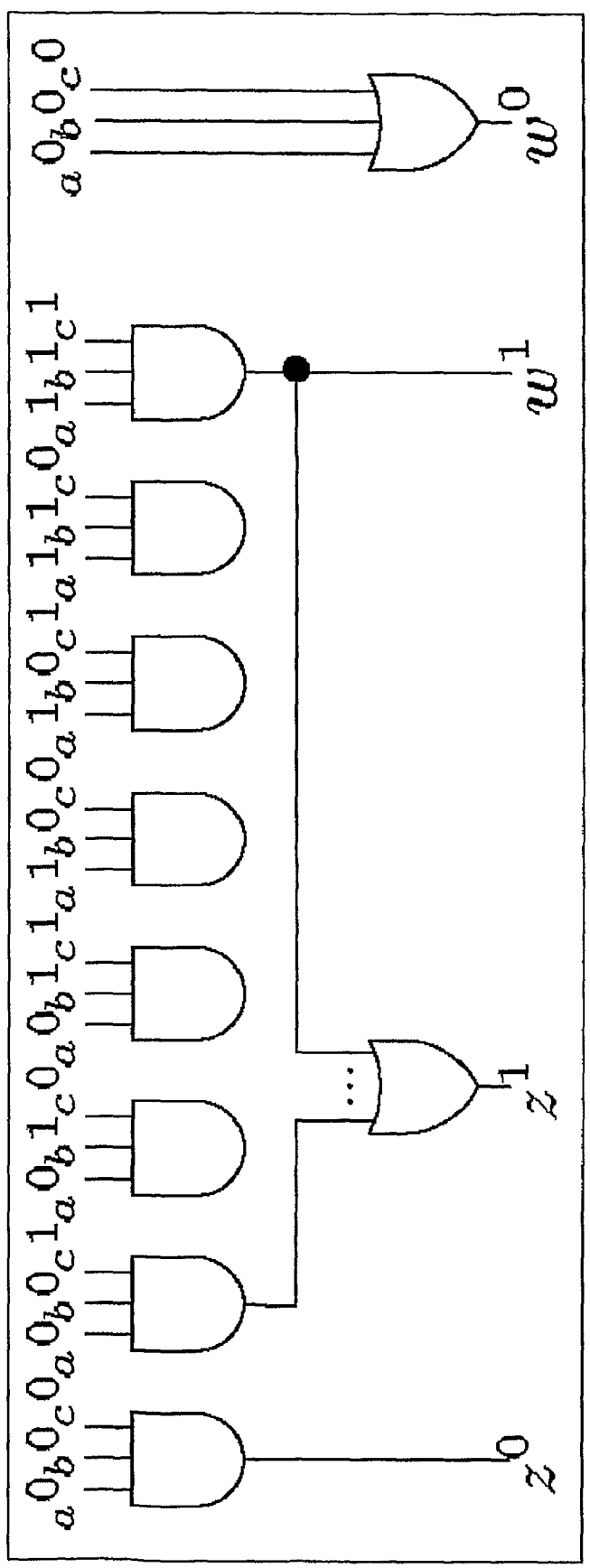

Other embodiments can implement vertices in a partially-eager manner. For example, referring to the network 1420 of FIG. 14, vertices A and C can each be implemented using the input-complete block of FIG. 16. In FIG. 16, the output 'w' is implemented in an eager manner and the output is 'z' is implemented in an input-complete manner. That is, rather than waiting for all its inputs signals to arrive, 'w' can be computed in a eager manner. For example, when 'a'=0, $w_0$ fires without waiting for other inputs. A benefit of this implementation is that the delay from inputs to 'w' can be reduced. This type of input-complete implementation can be referred to as a biased implementation.

Figure 17:
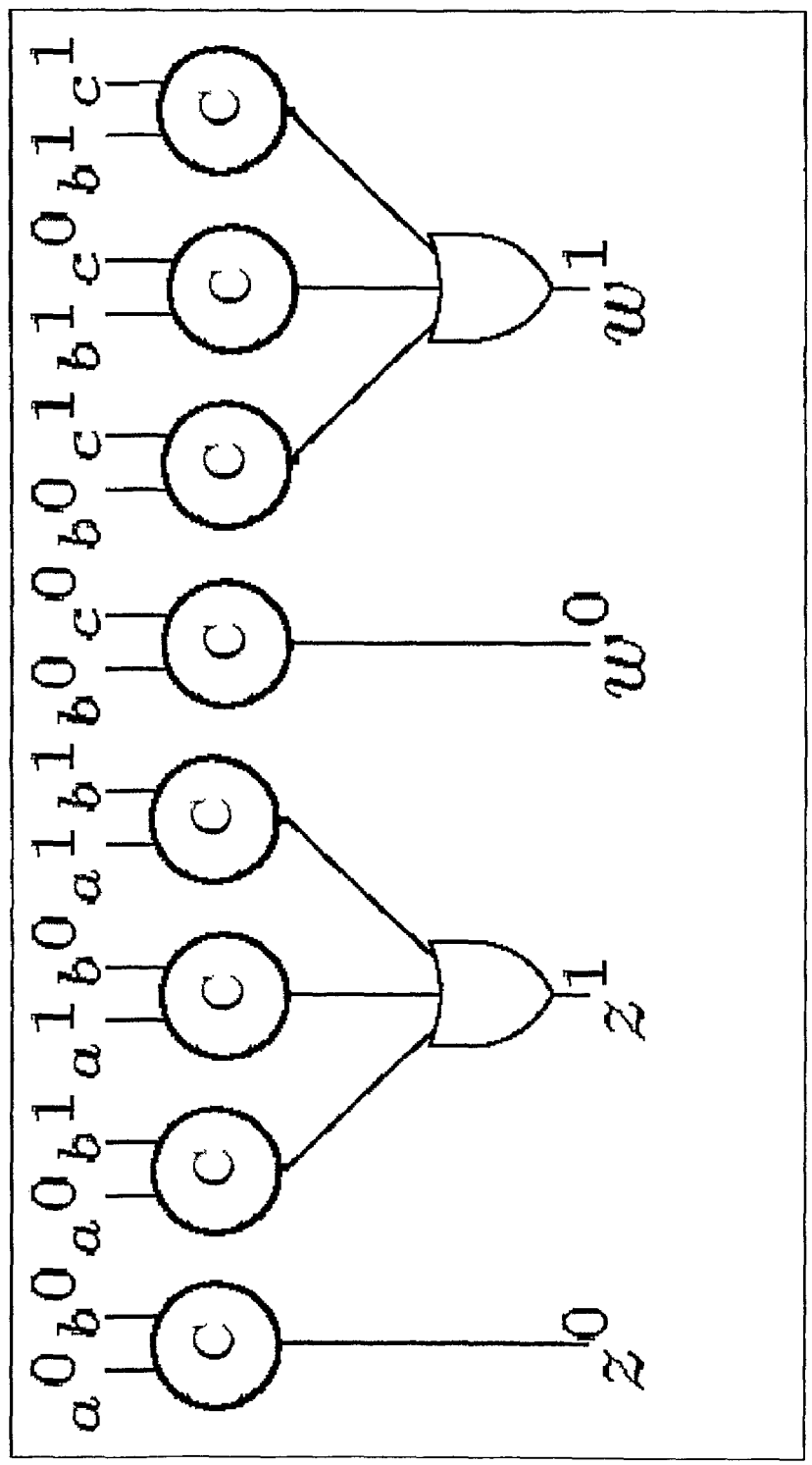
FIG. 17 is an illustration of a distributive implementation of the three-input, two-output block of FIG. 14 in accordance with some embodiments of the disclosed subject matter.

Whereas the network of FIG. 16 allowed only one output of an input-complete vertex to be eager, other embodiments can ensure, for example, that each input is property acknowledged by at least one output. In such embodiments, the responsibility of ensuring input completeness for input signals can be distributed across the node's multiple outputs. For example, consider a 3 input, two-output block defined by z=a+b and w=b+c. FIG. 17 illustrates an input-complete implementation, which can be referred to as distributive, of such a block where input completeness to the input signals are jointly ensured by the two outputs. The implementation of 'z' is input-complete with respect to 'a' and 'b', while the implementation of 'w' is input-complete with respect to 'b' and 'c.'

Figure 18:
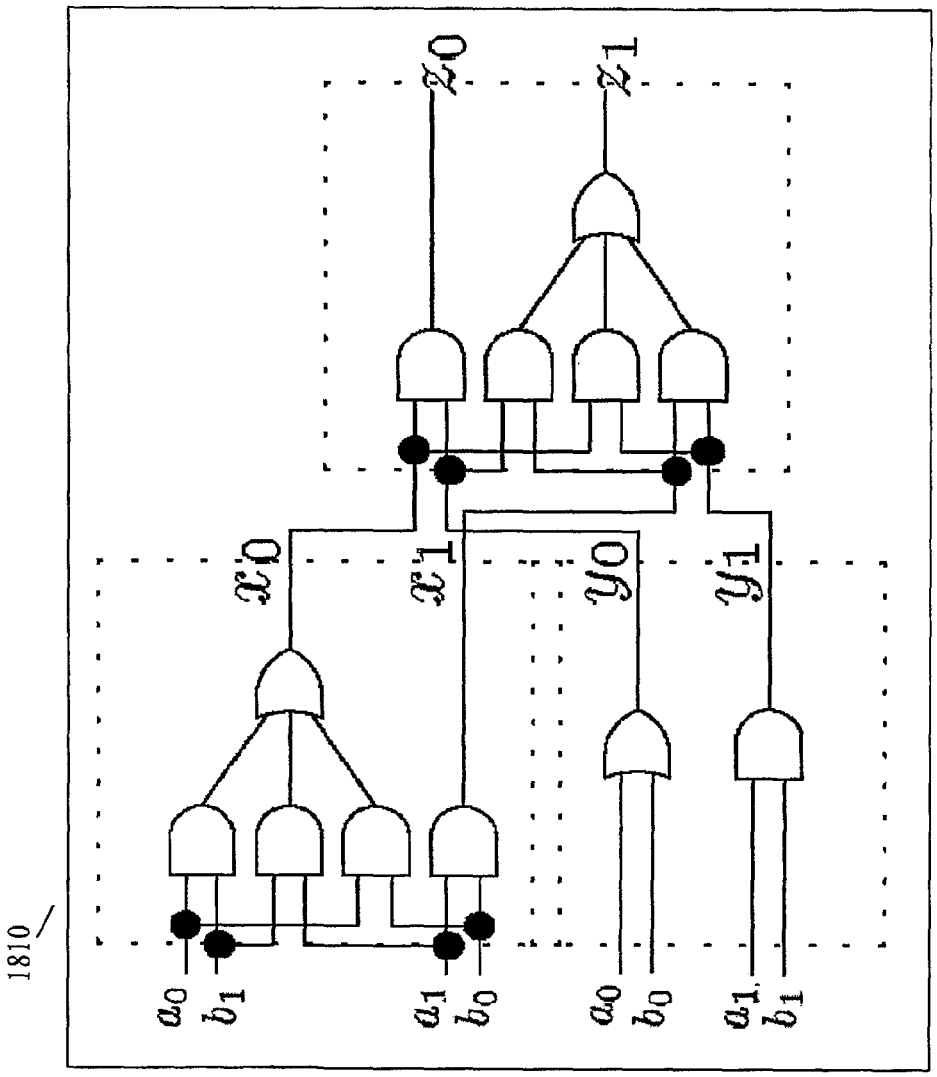
FIG. 18 is another illustration of an implementation of an XOR network that can be used in accordance with some embodiments of the disclosed subject matter.

In some cases, a network designer may require a network to be robust in only one of the set or reset phase. For example, in some embodiments, if a network needs only to be robust in the set phase, it need not be designed to be robust in the reset phase. In other embodiments, if a network needs only to be robust in the reset phase, it need not be designed be robust in the set phase. For example, returning to FIG. 9, implementations of the 3NCL gates of column 911 that are robust in only the set phase can be created by replacing the C-elements of the implementations of column 912 with AND gates. Also, for example, returning to FIG. 7, in some embodiments, network 710 (an XOR vertex) can be expanded, for example, to a dual-rail network with eager reset, as shown in FIG. 18. Network 1810 is equivalent to the network 740 of FIG. 7, except that the C-elements are replaced with AND gates. Network 1810 can evaluate robustly in a set phase, but may reset eagerly without waiting for all inputs to reset to 0's due to lack of state-holding capacity in AND gates.

Figure 17A:
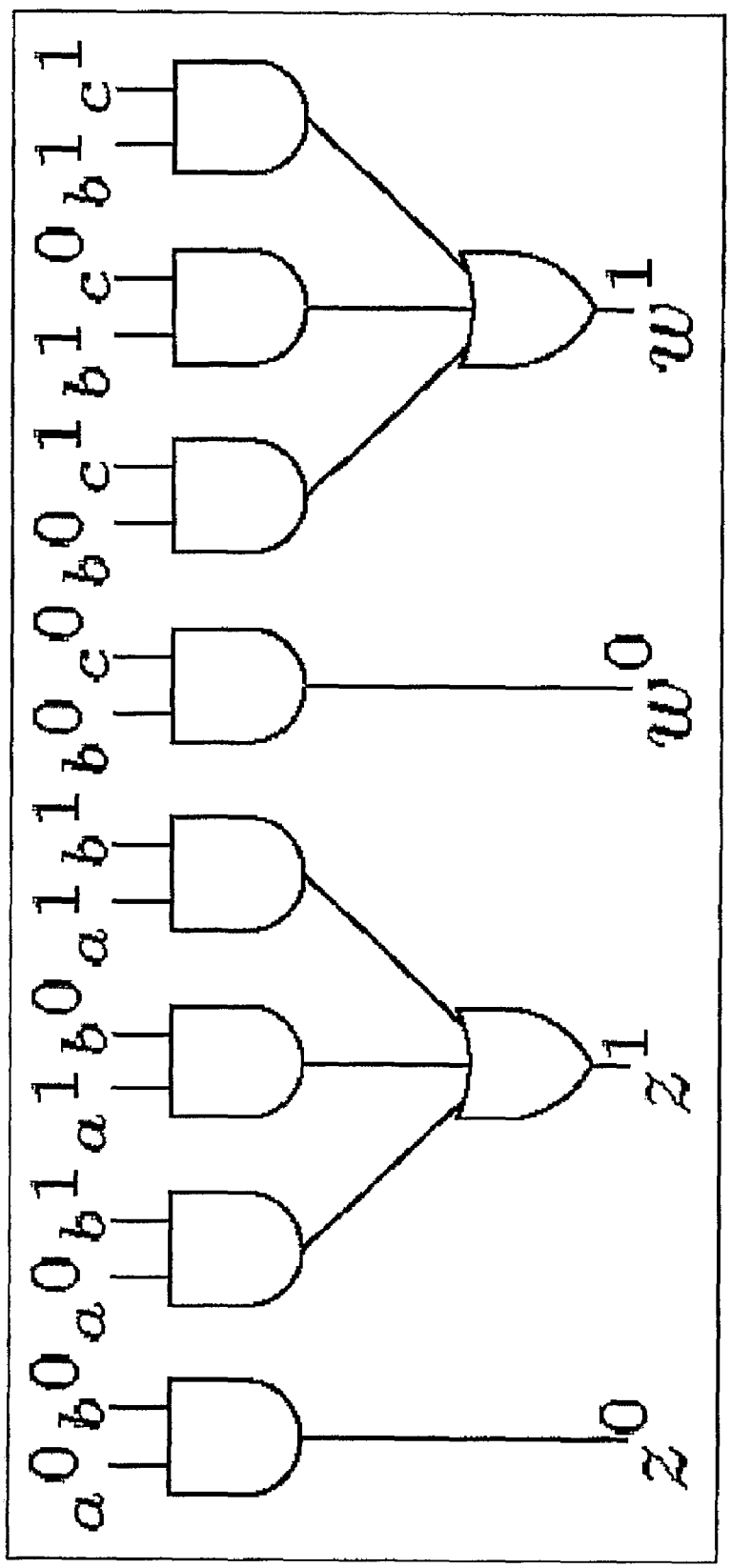
FIG. 17A is an illustration of another distributive implementation of the three-input, two-output block of FIG. 14 in accordance with some embodiments of the disclosed subject matter.

Embodiments of networks that are robust in only one phase can be made for both block level networks and gate level networks. FIGS. 15A, 16A, and 17A illustrate embodiments of 1510 of FIG. 15, FIG. 16, and FIG. 17 that are robust in only the set phase. The implementations of FIGS. 15A, 16A, and 17A can be used to replace, at 112, instances of block 1410 of FIG. 14 when, for example, a network 114 only needs to be robust in the set phase. However, in some embodiments, the networks illustrated in of FIGS. 15A, 16A, and 17A can also be used in a network 114 that is robust in both the set phase and reset phase, where, for example, the networks illustrated in of FIGS. 15A, 16A, and 17A are used to cover signals in only the set phase because those signals are covered by at least one other vertex in the reset phase.

Accordingly, in some embodiments, a vertex can be replaced, at 113 of FIG. 1, in a robust fashion in various ways (e.g., 1510 of FIG. 15, FIG. 16, FIG. 17, FIG. 15A, FIG. 16A, or FIG. 17A). A robust implementation of a multi-output Boolean block can be provided such that each output fires only after all inputs arrive. This can be, for example, a fully-robust implementation of the P/G block 1510 of FIG. 15 written as sum-of-products (SOP) expression 1910 is illustrated in FIG. 19.

Another robust implementation, a biased implementation, of a vertex can be provided where exactly one output fires regardless of the input arrival (i.e. eagerly evaluates) but all other outputs fire only after all inputs arrive. In general, for a multi-output Boolean block with k>1 outputs, there are k different ways to get a biased implementation which is eager with respect to a single output. A biased implementation of the full P/G block which are eager with respect to the output $a_{out}$ can be written as in the SOP expression 2010 of FIG. 20. In such an embodiment, the implementation of $g_{out}$ can be the same as the fully-robust implementation illustrated in 1910 of FIG. 19.

Yet another robust implementation, a distributive implementation, of a vertex can be provided where no output is input-complete with respect to its inputs but the set of inputs covered by each output jointly includes all inputs. A distributive implementation can be written as expressions 2020 of FIG. 20. In this distributive implementation, $g_{out}$ is responsible for the input completeness of inputs, $g_1$, $a_1$, and gr. Also, $a_{out}$ is responsible for the input completeness of $a_1$ and $a_r$. As a result, gout and $a_{out}$ jointly cover all four inputs of the block.

Figure 21:
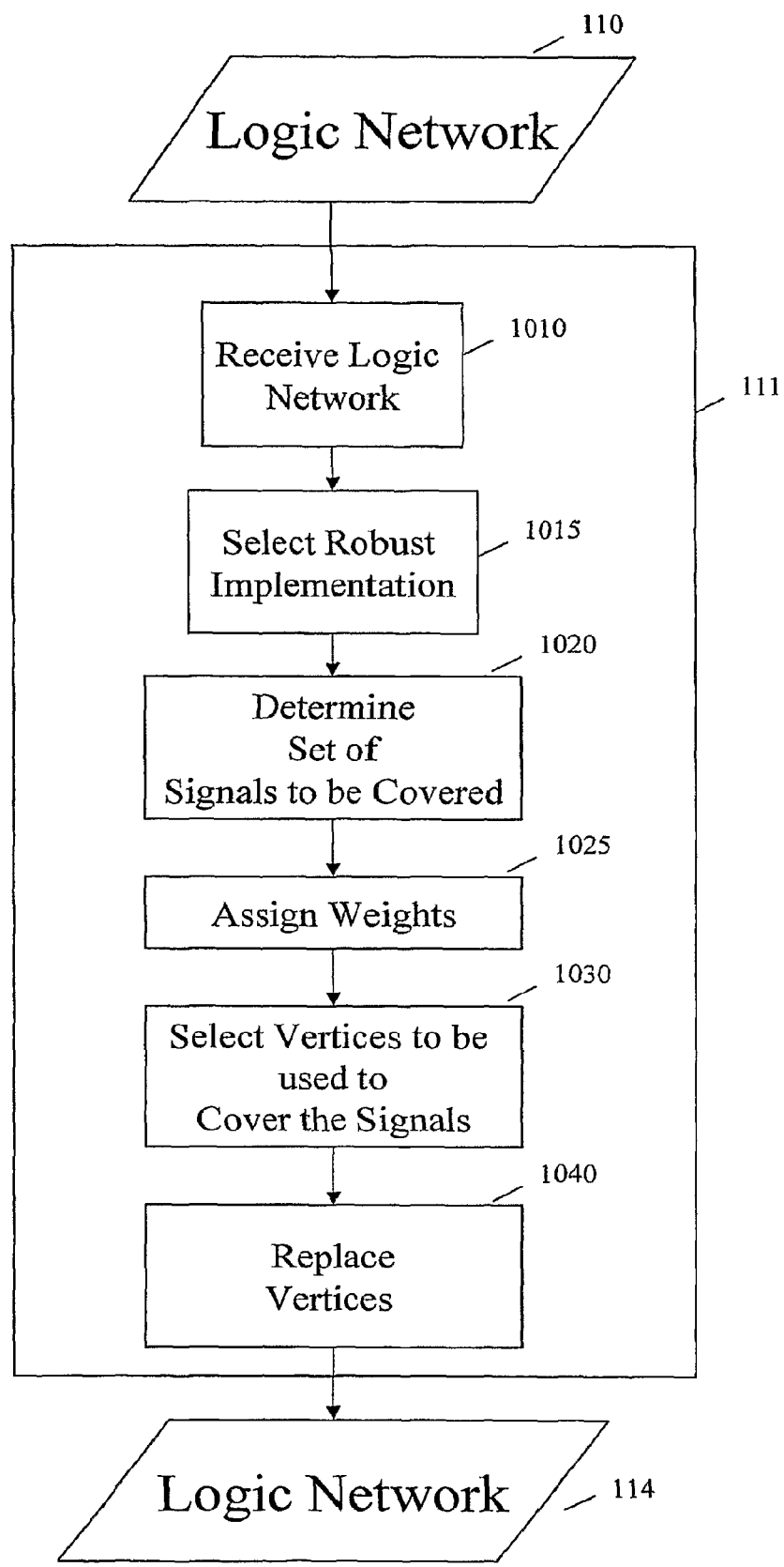
FIG. 21 is a simplified illustration of a method for forming an asynchronous logic network in accordance with some embodiments of the disclosed subject matter.

For example, FIG. 21 illustrates a method for forming a logic network where a vertex can be implemented using various robust implementations. As illustrated, a logic network 110 can be received at 1010. A robust implementation can be selected, at 1015, for each of the vertices. A set of signals to be covered can be determined, at 1020. Weights can be assigned, at 1025, to vertices based on, for example, a cost function. For example, a vertex can be assigned a weight equal to the difference in area between its selected robust implementation a possible relaxed implementation. Vertices can be selected, at 1030, based on the weights assigned at 1025 and such that for each signal in the set of signals there is at least one selected vertex that covers that signal. The selected vertices can be replaced, at 1040 with the robust vertices selected at 1015 and the non-selected vertices can be replaced, also at 1040, with relaxed vertices. As a result, a UCP can be created with an input complete vertex corresponding to a column of a UCP in table form.

Since only a single column is used for each vertex in a table, an input-complete implementation for each vertex can be chosen in advance. The choices of input-complete implementations can differ depending on, for example, the targeted cost function. For example, for area optimization, the input-complete implementation with the minimum area can be chosen for each column. A unate covering problem instance can be set up and the instance can be solved using a weighted unate covering problem solver. As a result, a set of vertices to be implemented robustly can be obtained.

In some embodiments, the method of FIG. 21 can be configured to maximize and/or increase the number of relaxed vertices. A weight function can be defined as the constant value 1 for each vertex. Since every vertex then has the same weight, the unate covering problem is aimed at minimizing the number of robust vertices, or maximizing the number of relaxed vertices. In some embodiments configured to increase the number of relaxed vertices, a fully-robust dual-rail implementation can be chosen, at 1015, for each non-relaxed vertex (i.e. column).

Other embodiments can focus on area-optimal/improved results using the unate covering approach, the cost function for columns can target the area after dual-rail expansion (i.e. looking ahead to the dual-rail library implementations of the vertices). Using this approach, the input-complete dual-rail implementation with the minimum area can be chosen, at 1010, for each vertex. As an example, for the full P/G block of FIG. 13, the input-complete dual-rail implementation with the minimum area can be a distributive implementation. To solve this optimization problem, a weight function can be defined for each vertex such that the weight of a vertex conveys information on area that the vertex will require after it is expanded in an input-complete way. The weight function used can be, for example, weight(v)=robust_area(v)−relaxed_area(v), where non_relaxed_area(v) is the area of the input-complete dual-rail implementation of the vertex v with the best area and relaxed_area(v) is the area of the relaxed dual-rail implementation.

Other embodiments can focus on improving critical path delay. For this cost function, the method of FIG. 21 can start by finding the critical path in, for example, a fully-expanded dual-rail implementation of the network. When the critical path of the dual-rail circuit is found, the vertices of original network that correspond to the critical path vertices of dual-rail netlist can be back-annotated. Higher weights can be assigned to critical vertices in the hope that non-critical vertices will be more likely to be picked for full expansion. After the critical path analysis, the set of "critical" vertices can be identified. Also, for each critical vertex with multiple outputs, the vertex output which is on the critical path can be identified. For each critical vertex, a biased implementation which is eager with respect to the critical output can be chosen. For each non-critical vertex, a distributive implementation can be chosen.

Selecting between various robust implementations can be performed at various times using various methods. For example, returning to FIG. 10, robust implementation can be selected, at 1015, before, during, or after any of receiving 1010, determining 1020, selecting 1030, and/or replacing 1040. In some embodiments, for example, selecting, at 1015, may not be performed separately and instead the selection between alternative robust implementations can be integrated with 1020.

To determine which robust implementation a vertex should be replaced with, at 1040, some embodiments can set up a table where a column corresponds to a vertex and a row corresponds to a signal. Each column can have multiple sub-columns that correspond to various alternative implementations of that vertex. One sub-column can be selected for a column. This selection can be based on, for example, a cost function. As a result, a binate covering problem can be created where an exclusive choice between sub-columns can be enforced by constraints of the rows in a covering table.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways within the scope and spirit of the invention.

What is claimed is:

1. A method for forming an asynchronous logic network, comprising:
   receiving a logic network including vertices and signals, wherein the vertices include vertices with multiple output signals;
   determining a set of signals of the signals included in the logic network to be covered;
   selecting at least one vertex in the logic network to cover each signal in the set of signals;
   replacing the at least one selected vertex with a robust vertex; and
   replacing at least one non-selected vertex with a relaxed vertex.

2. The method of claim 1, further comprising:
   assigning a weight to at least one of the vertices of the logic network based on the difference in area between a robust replacement of the at least one vertex and a relaxed replacement of the at least one vertex, wherein the selecting is based at least in part on the weight.

3. The method of claim 1, further comprising:
   assigning a weight to at least one of the vertices of the logic network based on the difference in power consumption between a robust replacement of the at least one vertex and a relaxed replacement of the at least one vertex, wherein the selecting is based at least in part on the weight.

4. The method of claim 3, wherein robust vertices comprise biased vertices and distributive vertices and wherein vertices on the at least one critical path are replaced with a biased vertices if they are selected and wherein vertices not on the at least one critical path are replaced with distributive vertices if they are selected.

5. The method of claim 1, further comprising:
   assigning a weight to at least one of the vertices of the logic network based on whether the at least one vertex is on the at least one critical path in a fully-robust implementation of the logic network, wherein the selecting is based at least in part on the weight.

6. The method of claim 1, wherein the selecting is based on at least one of reducing area, reducing critical path delay, reducing power consumption, and reducing the number of vertices selected.

7. The method of claim 1, further comprising selecting among at least two types of robust vertices.

8. The method of claim 1, further comprising selecting among at least two types of robust vertices before selecting at least one vertex in the logic network to cover each signal in the set of signals.

9. The method of claim 1, wherein a vertex covers a signal if the signal is an input to the vertex.

10. The method of claim 1, wherein a vertex covers a signal in only one of a set and reset phase and each signal in the set of signals is covered in both a set phase and a reset phase.

11. The method of claim 1, where a vertex covers a signal if the vertex provides robustness in only one of a set and reset phase and each signal in the set of signals is covered in both a set phase and reset phase.

12. The method of claim 1, where a vertex covers a signal if the vertex provides robustness in both a set and a reset phase.

13. The method of claim 1, further comprising:
   setting up a unate covering problem instance;
   solving the unate covering problem instance to produce a solution;
   wherein the selecting at least one vertex in the logic network to cover each signal in the set of signals is based on the solution.

14. The method of claim 1, further comprising:
   setting up a binate covering problem instance;
   solving the binate covering problem instance to produce a solution;
   wherein the selecting at least one vertex in the logic network to cover each signal in the set of signals is based at on the solution.

15. The method of claim 1, wherein the received logic network is a synchronous logic network and wherein the replacing the at least one selected vertex and replacing the at least one non-selected vertex forms an asynchronous logic network.

16. The method of claim 1, where in the received logic network is a 3NCL logic network.

17. The method of claim 1, wherein the robust vertex is input-complete.

18. The method of claim 1, wherein the robust vertex is robust in both a set and reset phase.

19. The method of claim 1, wherein the robust vertex is robust in only one of a set and reset phase.

20. The method of claim 1, wherein the robust vertex is fully-expanded.

21. The method of claim 1, wherein the vertices included in the logic network include logic gates.

22. The method of claim 1, wherein the at least one robust vertex is one of a biased vertex and a distributive vertex.

23. A computer-readable medium containing computer-executable instructions that, when executed by a processor, cause the processor to perform a method for forming an asynchronous logic network, the method comprising:
   receiving a logic network including vertices and signals, wherein the vertices include vertices with multiple output signals;
   determining a set of signals of the signals included in the logic network to be covered;
   selecting at least one vertex in the logic network to cover each signal in the set of signals;
   replacing the at least one selected vertex with a robust vertex; and
   replacing at least one non-selected vertex with a relaxed vertex.

24. The method of claim 23, further comprising:
   assigning a weight to at least one of the vertices of the logic network based on the difference in area between a robust replacement of the at least one vertex and a relaxed replacement of the at least one vertex, wherein the selecting is based at least in part on the weight.

25. The method of claim 23, further comprising:
   assigning a weight to at least one of the vertices of the logic network based on the difference in power consumption between a robust replacement of the at least one vertex and a relaxed replacement of the at least one vertex, wherein the selecting is based at least in part on the weight.

26. The method of claim 25, wherein robust vertices comprise biased vertices and distributive vertices and wherein vertices on the at least one critical path are replaced with a biased vertices if they are selected and wherein vertices not on the at least one critical path are replaced with distributive vertices if they are selected.

27. The method of claim 23, further comprising:
   assigning a weight to at least one of the vertices of the logic network based on whether the at least one vertex is on the at least one critical path in a fully-robust implementation of the logic network, wherein the selecting is based at least in part on the weight.

28. The method of claim 23, wherein the selecting is based on at least one of reducing, reducing critical path delay, reducing power consumption, and reducing the number of vertices selected.

29. The method of claim 23, further comprising selecting among at least two types of robust vertices.

30. The method of claim 23, further comprising selecting among at least two types of robust vertices before selecting at least one vertex in the logic network to cover each signal in the set of signals.

31. The method of claim 23, wherein a vertex covers a signal if the signal is an input to the vertex.

32. The method of claim 23, wherein a vertex covers a signal in only one of a set and reset phase.

33. The method of claim 23, where a vertex covers a signal if the vertex provides robustness in only one of a set and reset phase and each signal in the set of signals is covered in both a set phase and a reset phase.

34. The method of claim 23, where a vertex covers a signal if the vertex provides robustness in both a set phase and a reset phase.

35. The method of claim 23, further comprising:
setting up a unate covering problem instance;
solving the unate covering problem instance to produce a solution;
wherein the selecting at least one vertex in the logic network to cover each signal in the set of signals is based on the solution.

36. The method of claim 23, further comprising:
setting up a binate covering problem instance;
solving the binate covering problem instance to produce a solution;
wherein the selecting at least one vertex in the logic network to cover each signal in the set of signals is based at on the solution.

37. The method of claim 23, wherein the received logic network is a synchronous logic network and wherein the replacing the at least one selected vertex and replacing the at least one non-selected vertex forms an asynchronous logic network.

38. The method of claim 23, where in the received logic network is a 3NCL logic network.

39. The method of claim 23, wherein the robust vertex is input-complete.

40. The method of claim 23, wherein the robust vertex is robust in both a set phase and a reset phase.

41. The method of claim 23, wherein the robust vertex is robust in only one of a set phase and a rest phase.

42. The method of claim 23, wherein the robust vertex is fully-expanded.

43. The method of claim 23, wherein the vertices included in the logic network are logic gates.

44. The method of claim 23, wherein the vertices included in the logic network are blocks with multiple inputs and multiple outputs.

45. The method of claim 23, wherein the at least one robust vertex is one of a biased vertex and a distributive vertex.

46. A system for forming an asynchronous logic network comprising:
means for receiving a logic network including vertices and signals, wherein the vertices include vertices with multiple output signals;
means for determining a set of signals of the signals included in the logic network to be covered;
means for selecting at least one vertex in the logic network to cover each signal in the set of signals;
means for replacing the at least one selected vertex with a robust vertex; and
means for replacing at least one non-selected vertex with a relaxed vertex.

47. The system of claim 46, further comprising:
means for assigning a weight to at least one of the vertices of the logic network based on the difference in at least one of area and power consumption between a robust replacement of the at least one vertex and a relaxed replacement of the at least one vertex, wherein the selecting is based at least in part on the weight.

48. The system of claim 46, further comprising:
means for assigning a weight to at least one of the vertices of the logic network based on whether the at least one vertex is on the at least one critical path in a fully-robust implementation of the logic network, wherein the selecting is based at least in part on the weight.

* * * * *